US012598904B2

(12) United States Patent
Ahn et al.

(10) Patent No.: US 12,598,904 B2
(45) Date of Patent: Apr. 7, 2026

(54) ROLLABLE DISPLAY DEVICE INCLUDING ROTATABLE SUPPORTING PARTS

(71) Applicant: Samsung Display Co., LTD., Yongin-si (KR)

(72) Inventors: Jaeho Ahn, Yongin-si (KR); Beomjin Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 155 days.

(21) Appl. No.: 18/406,104

(22) Filed: Jan. 6, 2024

(65) Prior Publication Data

US 2024/0373732 A1     Nov. 7, 2024

(30) Foreign Application Priority Data

May 3, 2023     (KR) .......................... 10-2023-0057905

(51) Int. Cl.
*H10K 77/10*          (2023.01)
*F16M 11/20*          (2006.01)
*H10K 102/00*         (2023.01)

(52) U.S. Cl.
CPC ....... *H10K 77/111* (2023.02); *F16M 11/2028* (2013.01); *H10K 2102/311* (2023.02)

(58) Field of Classification Search
CPC ............ H10K 77/111; H10K 2102/311; F16M 11/2028; H04M 1/0227; H04M 1/0237; G06F 1/1681; G06F 1/1637; G06F 1/1652
See application file for complete search history.

(56) References Cited

U.S. PATENT DOCUMENTS

| | | |
|---|---|---|
| 9,519,313 B2 | 12/2016 | Kim et al. |
| 11,272,626 B2 | 3/2022 | Lee et al. |
| 11,315,443 B2 * | 4/2022 | Han ..................... G06F 1/1624 |

(Continued)

FOREIGN PATENT DOCUMENTS

| | | |
|---|---|---|
| KR | 1020210017058 A | 2/2021 |
| KR | 1020210116542 A | 9/2021 |

(Continued)

OTHER PUBLICATIONS

Concept Phone Full Tech Video—OPPO; Oct. 19, 2023; 2 pages; https://youtu.be/e_g4A8dzrNO.

*Primary Examiner* — Allen L Parker
*Assistant Examiner* — Peter Krim
(74) *Attorney, Agent, or Firm* — CANTOR COLBURN LLP

(57) ABSTRACT

A display device includes: a shaft extending in a first direction; a display module wound around the shaft in a first state, and unwound from the shaft in a second direction crossing the first direction in a second state; a first roller and a second roller positioned on opposite sides of the shaft in the first direction, respectively; and a first supporting part and a second supporting part which shrink in the second direction in the first state, and extend in the second direction in the second state to support opposite sides of the display module, respectively, where the first roller and the second roller are in contact with the first supporting part and the second supporting part, respectively, and rotate according to the shrinking and extending of the first supporting part and the second supporting part in the second direction.

20 Claims, 17 Drawing Sheets

(56)          References Cited

U.S. PATENT DOCUMENTS

| | | | | |
|---|---|---|---|---|
| 2013/0058063 A1* | 3/2013 | O'Brien | ............... | G06F 1/1624 |
| | | | | 361/807 |
| 2016/0120022 A1* | 4/2016 | Lee | .................... | H04M 1/0268 |
| | | | | 361/749 |
| 2020/0033913 A1* | 1/2020 | Yang | ................... | H04M 1/0268 |
| 2020/0060028 A1* | 2/2020 | Kim | ....................... | H10K 50/84 |
| 2020/0264660 A1 | 8/2020 | Song et al. | | |
| 2021/0044683 A1* | 2/2021 | He | ........................ | G06F 1/1652 |
| 2023/0097200 A1* | 3/2023 | Feng | .................... | G06F 1/1624 |
| | | | | 361/679.01 |

FOREIGN PATENT DOCUMENTS

| | | | |
|---|---|---|---|
| KR | 102339290 B1 | 12/2021 | |
| KR | 102382300 B1 | 4/2022 | |

* cited by examiner

ROLLABLE DISPLAY DEVICE INCLUDING ROTATABLE SUPPORTING PARTS

This application claims priority to Korean Patent Application No. 10-2023-0057905, filed on May 3, 2023, and all the benefits accruing therefrom under 35 U.S.C. § 119, the content of which in its entirety is herein incorporated by reference.

BACKGROUND

The present disclosure herein relates to a display device, and more particularly, to a display device capable of rolling or sliding.

A display device for providing images to a user, such as a smartphone, a digital camera, a laptop computer, a navigation system, and a smart television, includes an electronic device. The display device generates an image, and provides the image to a user through a display screen.

Display devices in various forms are being developed with recent technological development of the display device. For example, various flexible display devices are being developed to be deformable into curved surfaces, slidable, foldable, or rollable. The flexible display devices may be easily portable, and may improve the user's convenience.

SUMMARY

The present disclosure provides a display device with increased utilization of a space in a housing, and enabling microminiaturization.

An embodiment of the invention provides a display device including: a shaft extending along a first direction; a display module wound around the shaft in a first state, and unwound from the shaft in a second direction crossing the first direction in a second state; a first roller and a second roller positioned on opposite sides of the shaft in the first direction, respectively; and a first supporting part and a second supporting part which shrink in the second direction in the first state, and which extend in the second direction in the second state to support opposite sides of the display module, respectively, where the first roller and the second roller are in contact with the first supporting part and the second supporting part, respectively, and rotate according to the shrinking and the extending of the first supporting part and the second supporting part in the second direction.

In an embodiment, the display device may further include a housing which accommodates the shaft, the display module, the first roller, the second roller, the first supporting part, and the second supporting part in the first state, and in the second state, the display module, the first supporting part, and the second supporting part may be drawn out of the housing, and the drawn-out first and second supporting parts may support the drawn-out display module.

In an embodiment, each of the first roller and the second roller may include a first gear, and each of the first supporting part and the second supporting part may include a plurality of supports including a second gear engaged with the first gear.

In an embodiment, the display device may further include a coupling member configured to couple supports adjacent to each other among the plurality of supports, and the supports adjacent to each other may be rotatable with respect to the coupling member.

In an embodiment, at least one of the display module, the first supporting part, or the second supporting part may include a magnetic substance.

In an embodiment, the plurality of supports may include a first supporting portion overlapping the display module, and a second supporting portion not overlapping the display module, and including the second gear.

In an embodiment, the housing may further include a first accommodation part and a second accommodation part which are spaced apart from each other, and the first supporting part and the second supporting part may be arranged in the first accommodation part and the second accommodation part in the first state, respectively.

In an embodiment, the housing may include an accommodation space overlapping the first accommodation part or the second accommodation part in a third direction crossing the first direction and the second direction, and at least one electronic module may be disposed in the accommodation space.

In an embodiment, the first accommodation part and the second accommodation part may be disposed on the same surface in the housing, and the second accommodation part may be disposed apart from the shaft with the first accommodation part therebetween.

In an embodiment, the first accommodation part may be defined by a first division member extending in the first direction and a second division member connected to one side of the first division member, and the second accommodation part may be defined by a third division member extending in the first direction and a fourth division member connected to one side of the third division member.

In an embodiment, each of the first and second division members may be provided in plurality, at least one of the second division members may be disposed between first division members adjacent to each other among the first division members, each of the third and fourth division members may be provided in plurality, and at least one of the fourth division members may be disposed between third division members adjacent to each other among the third division members.

In an embodiment, the shaft may be provided in plurality, and the plurality of shafts may include a first shaft around which the display module is wound or from which the display module is unwound, and a second shaft disposed apart from the first shaft in the second direction, and configured to change an extension direction of the display module unwound from the first shaft.

In an embodiment of the invention, a display device includes: a housing; a shaft accommodated in the housing and extending in a first direction; a display module at least a portion of which is accommodated in the housing, and which is wound around the shaft in a first state and is unwound from the shaft in a second direction crossing the first direction to be drawn out of the housing in a second state; a first roller and a second roller positioned on opposite sides of the shaft, respectively; a first supporting part including a plurality of supports configured to rotate the first roller; and a second supporting part including a plurality of supports configured to rotate the second roller. In the first state, the plurality of supports, included in the first supporting part and the second supporting part, are accommodated in the housing, and in the second state, the plurality of supports support the display module drawn out of the housing.

In an embodiment, in the first state, the plurality of supports may be arranged along a direction different from the first direction, and in the second state, the plurality of supports may be arranged along the second direction.

In an embodiment, the display device may further include a coupling member configured to couple supports adjacent to each other among the supports, and the supports adjacent to each other may be rotatable with respect to the coupling member.

In an embodiment, each of the first roller and the second roller may include a first gear, and the supports may include a second gear engaged with the first gear.

In an embodiment, the plurality of supports may include a first supporting portion overlapping the display module, and a second supporting portion not overlapping the display module, and including the second gear.

In an embodiment, the housing may further include a first accommodation part and a second accommodation part which are spaced apart from each other, the supports of the first supporting part may be arranged in the first accommodation part in the first state, and the supports of the second supporting part may be arranged in the second accommodation part in the first state.

In an embodiment, the housing may further include a first surface on which the first accommodation part and the second accommodation part are defined, a second surface opposed to the first surface, and a third surface connecting the first surface to the second surface, and the second accommodation part may be disposed apart from the shaft with the first accommodation part therebetween.

In an embodiment, the first accommodation part may be defined by a first division member extending in the first direction and a second division member connected to one side of the first division member, and the second accommodation part may be defined by a third division member extending in the first direction and a fourth division member connected to one side of the third division member.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
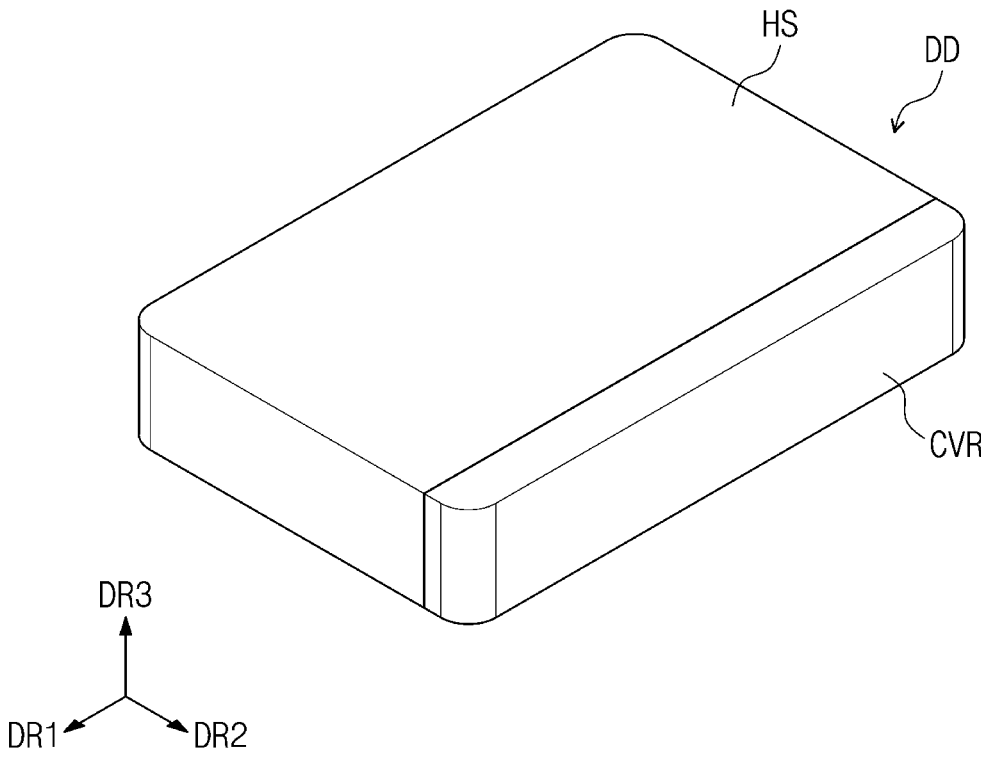
FIG. 1 is a perspective view of a display device according to an embodiment of the invention.

In this specification, it will be understood that when an element (or a region, a layer, a portion, or the like) is referred to as being "on", "connected to" or "coupled to" another element, it may be directly disposed on, connected or coupled to the other element, or intervening elements may be disposed therebetween.

Like reference numerals or symbols refer to like elements throughout. In the drawings, the thickness, the ratio, and the size of the element are exaggerated for effective description of the technical contents. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the scope of the invention. Similarly, a second element, component, region, layer or section may be termed a first element, component, region, layer or section. As used herein, the singular forms, "a", "an" and "the" are intended to include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

It will be further understood that the terms "includes" and/or "have", when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. Hereinafter, a display device according to an embodiment of the invention will be described with reference to the accompanying drawings.

Figure 2:
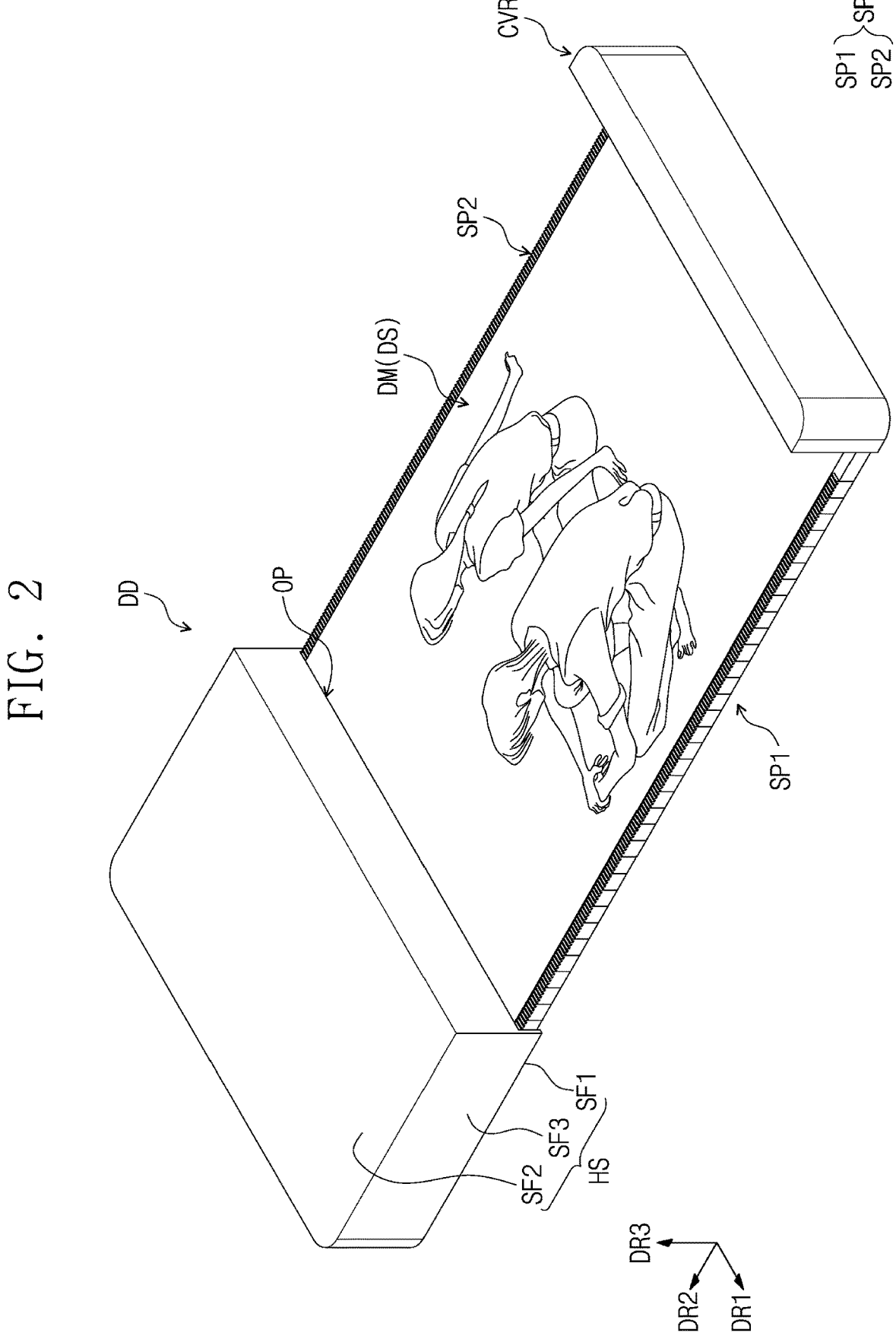
FIG. 2 is a perspective view of a display device according to an embodiment of the invention.

FIGS. 1 and 2 are perspective views of a display device according to an embodiment of the invention. In particular, FIG. 2 is a drawing illustrating a display module exposed to the outside of a housing illustrated in FIG. 1.

Referring to FIGS. 1 and 2, a display device DD may include a housing HS, a cover CVR, and a display module DM.

Hereinafter, in this specification, a first direction DR1, a second direction DR2 crossing the first direction DR1, and a third direction DR3, perpendicular to a plane defined by the first and second directions DR1 and DR2, are defined.

Referring to the drawing, the housing HS may extend further in the first direction DR1 than in the second direction DR2 and the third direction DR3. The housing HS may extend further in the second direction DR2 than in the third direction DR3, but an embodiment of the invention is not limited to what is illustrated in the drawing. The housing HS may extend further in the second direction DR2 or the third direction DR3 than in the first direction DR1, and is not limited to any one embodiment of the invention.

The housing HS may expose a display surface DS of the display module DM to the outside. For example, the display surface DS of the display module DM may be exposed to the outside according to movement of the housing HS (or the cover CVR).

The housing HS may support the display module DM, and the display module DM may be supported in the outside of the housing HS, or accommodated in the housing HS and supported by components inside the housing HS.

For example, at least a portion of the display module DM may be accommodated in the housing HS, so that the display surface DS of the display module DM may not be exposed to the outside of the housing HS, and the display module DM accommodated in the housing HS may be drawn out of the housing HS, so that the display surface DS of the display module DM may be exposed.

According to an embodiment of the invention, an inner space INS (see FIG. 8A) where the display module DM is accommodated may be defined in the housing HS, and an entrance part OP, which opens the inner space INS (see FIG. 8A) and through which the display module DM is drawn in or drawn out, may be defined in the housing HS. The housing HS may include a plurality of surfaces SF1, SF2, and SF3 defining the inner space INS (see FIG. 8A). The entrance part OP that opens the inner space INS (see FIG. 8A) along the first direction DR1 may be defined on any one among the plurality of surfaces SF1, SF2, and SF3. For example, the housing HS may include a first surface SF1, a second surface SF2 which is opposed to the first surface SF1, and a third surface SF3 which connects the first surface SF1 and the second surface SF2, and the entrance part OP may be defined on a portion of the third surface SF3.

Referring to the drawing, the entrance part OP is illustrated to be defined on a side surface of the housing HS, but an embodiment of the invention is not limited thereto. In another embodiment, the entrance part OP may be defined on an upper surface of the housing HS, and is not limited to any one embodiment of the invention.

The cover CVR may be disposed on one side among opposite sides of the housing HS that are opposed to each other in the second direction DR2. The cover CVR may have a flat surface defined by the first and third directions DR1 and DR3. The cover CVR may extend further in the first direction DR1 than in the third direction DR3. The cover CVR may be moveable to be away from or closer to the housing HS in the second direction DR2.

The entrance part OP may be defined on one side among opposite sides of the housing HS that are opposed to each other in the second direction DR2. The cover CVR may be disposed adjacent to the entrance part OP, and moveable to be away from or closer to the entrance part OP. One end of the display module DM may be connected to the cover CVR through the entrance part OP.

The cover CVR may serve as a handle. As a user, etc. holds the cover CVR, the display device DD may be changed from a state in FIG. 1 to a state in FIG. 2. However, an embodiment of the invention is not limited thereto, and as the user holds the cover CVR, the display device DD may be changed from the state in FIG. 2 to the state in FIG. 1.

The cover CVR may be provided in substantially the same structure as the housing HS to be described later, and may have components each disposed in a form symmetrical to those of the housing HS to be described later, but is not limited to any one embodiment of the invention.

The display device DD may include a supporting part SP which is disposed under the display module DM to support the display module DM. The supporting part SP may be disposed in the housing HS, and one end of the supporting part SP may be connected to the cover CVR through the entrance part OP. The supporting part SP may include a first supporting part SP1 and a second supporting part SP2 disposed on opposite sides of the display module DM, respectively.

The display module DM and the supporting part SP may be accommodated in the housing HS. The display module DM and the supporting part SP may be drawn out of the housing HS or drawn into the housing HS through the entrance part OP. The display module DM and the supporting part SP may be drawn out of the housing HS or drawn into the housing HS according to the movement of the cover CVR. For example, according to the movement of the cover CVR in the second direction DR2, the supporting part SP, which is coupled to the cover CVR, may shrink or extend in the second direction DR2, or the arrangement of the supporting part SP may be changed, and a portion of the supporting part SP may move together with the cover CVR in the second direction DR2, or the supporting part SP may shrink or extend in the second direction DR2.

FIGS. 1 and 2 exemplarily illustrate the display device DD as a portable device, but an embodiment of the invention is not limited thereto, and the display device DD may be a car navigation system, a dashboard, a laptop computer, a computer, a smart television, or the like, and is not limited to any one embodiment of the invention.

At this time, as the arrangement of the supporting part SP is changed, or the supporting part SP shrinks or extends in the second direction DR2, a first state, in which the display module DM is accommodated in the housing HS, and a second state, in which the display surface DS of the display module DM is exposed, may be defined. For example, the first state may refer to a state in which the display module DM is drawn into the housing HS, so that almost entire display module DM is accommodated in the housing HS, and the second state may refer to a state in which at least a portion of the display module DM is drawn out of the housing HS, so that the display module DM is exposed.

Referring to the drawing, the display device in FIG. 1 may present the first state, and the display device in FIG. 2 may present the second state. Details of these will be described later.

Figure 3:
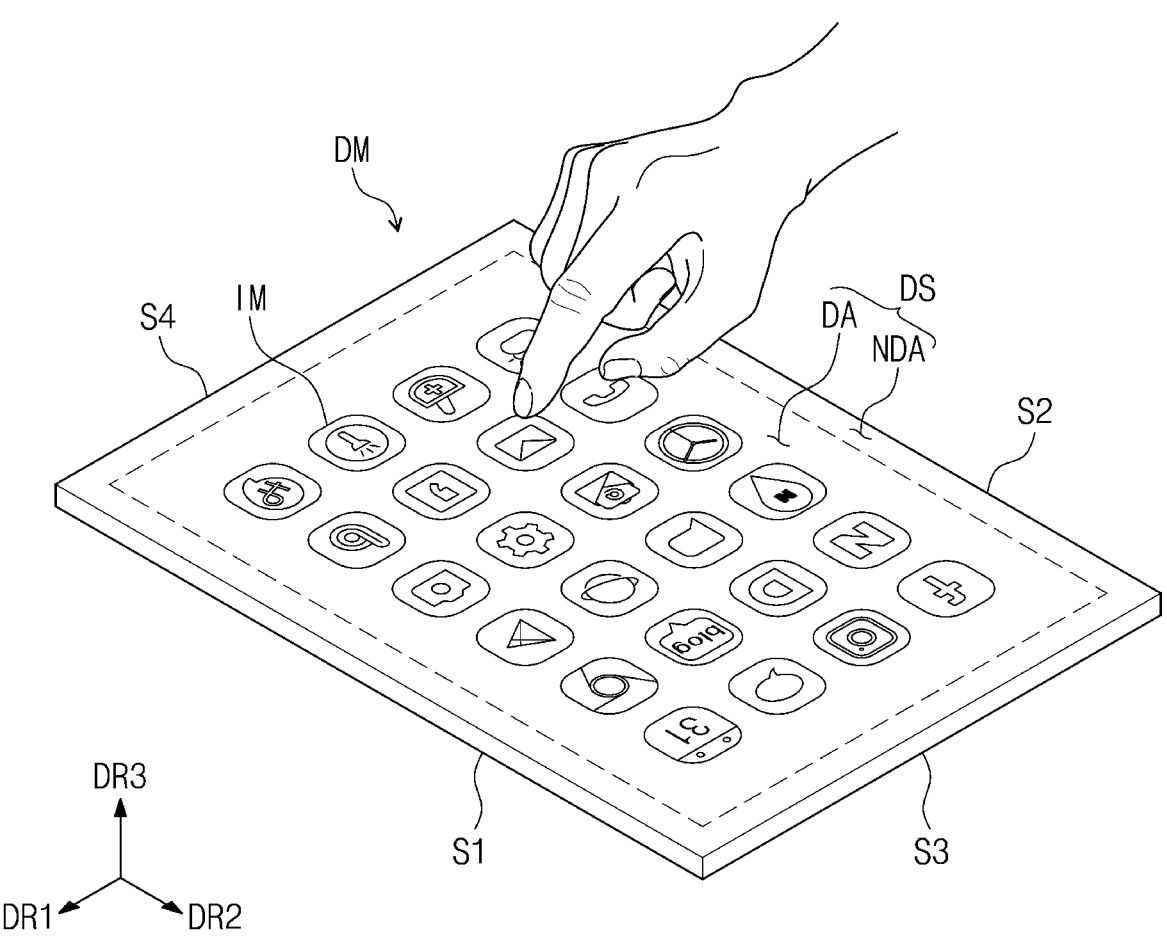
FIG. 3 is a perspective view of a display module according to an embodiment of the invention.
Figure 4:
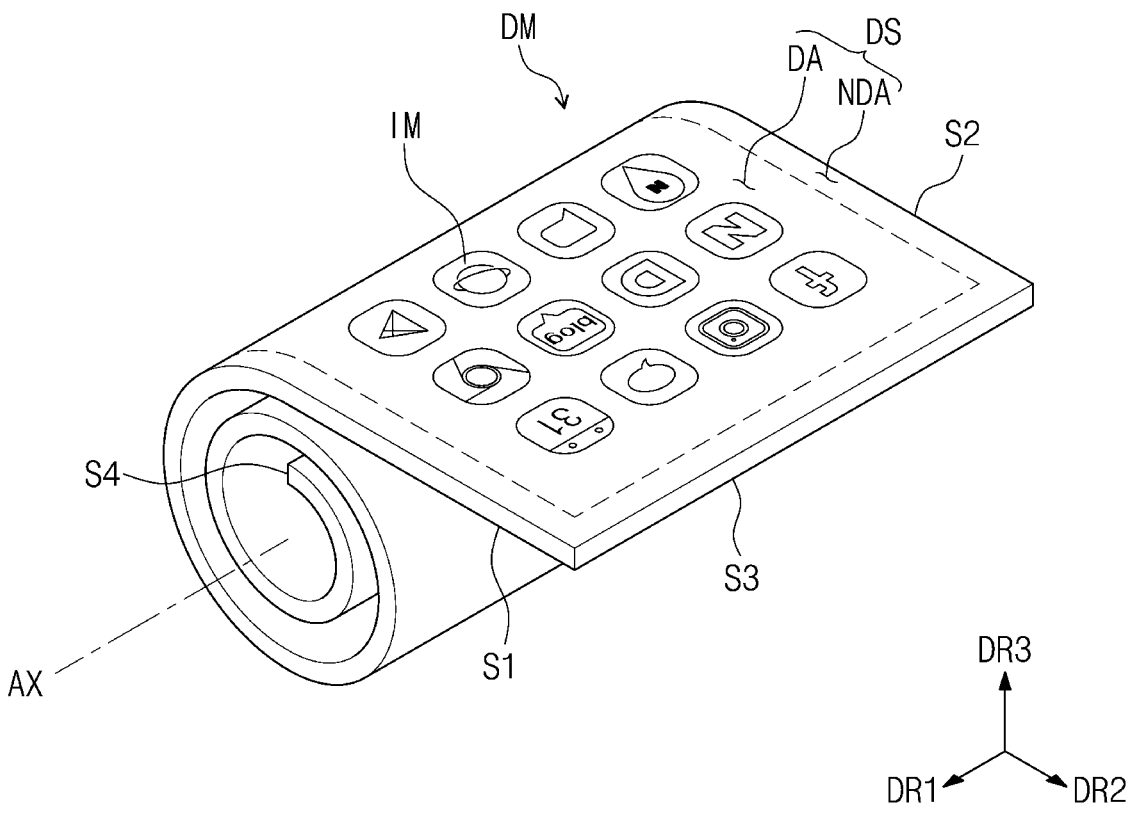
FIG. 4 is a drawing illustrating a rolling state of a display module according to an embodiment of the invention.

FIG. 3 is a perspective view of a display module according to an embodiment of the invention, and FIG. 4 is a drawing illustrating a rolling state of a display module according to an embodiment of the invention. In particular, FIG. 3 is a drawing illustrating a display module accommodated in the housing illustrated in FIG. 1, and FIG. 4 is a drawing illustrating a rolling state of the display module illustrated in FIG. 3.

Referring to FIG. 3, an upper surface of a display module DM may be defined as a display surface DS, and may have a flat surface defined by a first direction DR1 and a second direction DR2. Images IM generated in the display module DM may be provided to a user through the display surface DS.

The display surface DS may include a display region DA and a non-display region NDA around the display region DA. The display region DA displays an image, and the non-display region NDA may not display an image. The non-display region NDA may surround the display region DA, and may define a border of the display module DM which is printed in a predetermined color.

The display module DM may include a first side S1 and a second side S2 opposed to each other in the first direction DR1. In addition, the display module DM may include a third side S3 and a fourth side S4 opposed to each other in the second direction DR2.

Referring to FIG. 4, the display module DM may be a flexible display module DM. The display module DM may be rolled or unrolled in the second direction DR2. The display module DM may be rolled such that the display surface DS faces outward.

For example, the display module DM may be rolled or unrolled in the second direction DR2 with respect to a reference axis AX adjacent to the fourth side S4. However, an embodiment of the invention is not limited thereto. In another embodiment, the reference axis AX may be provided to be adjacent to the third side S3, and the display module DM may be rolled or unrolled in the second direction DR2 with respect to the reference axis adjacent to the third side S3, and the position of the reference axis is not limited to any one embodiment of the invention.

Referring to the drawing, the display module DM is illustrated to be only rollable with respect to the reference axis AX, but an embodiment of the invention is not limited thereto. In another embodiment, the display module DM may be foldable with respect to the reference axis AX, and is not limited to any one embodiment of the invention.

Figure 5:
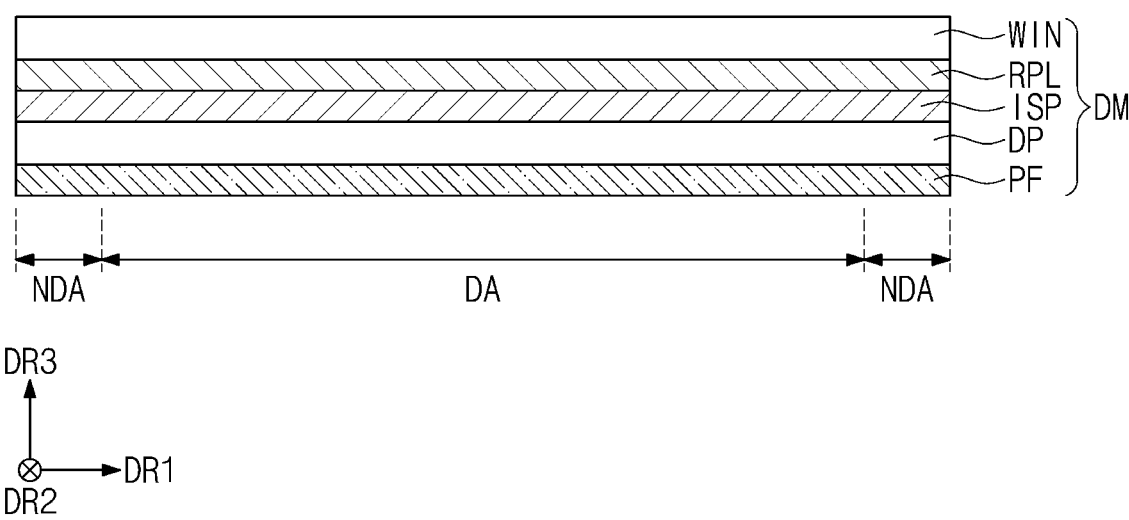
FIG. 5 is a cross-sectional view of a display module according to an embodiment of the invention.

FIG. 5 is a cross-sectional view of a display module according to an embodiment of the invention. In particular, FIG. 5 is a drawing exemplarily illustrating a cross-section of the display module illustrated in FIG. 3.

As an example, FIG. 5 illustrates a cross-section of a display module DM viewed from a second direction DR2.

Referring to FIG. 5, the display module DM may include a display panel DP, an input-sensing part ISP, an anti-reflection layer RPL, a window WIN, and a panel protection film PF.

The display panel DP may be a flexible display panel. The display panel DP according to an embodiment of the invention may be an emission-type display panel, and the type is not particularly limited. For example, the display panel DP may be an organic light-emitting display panel or an inorganic light-emitting display panel. A light-emitting layer of the organic light-emitting display panel may include an organic light-emitting material. A light-emitting layer of the inorganic light-emitting display panel may include quantum dots, quantum rods, etc. Hereinafter, the display panel DP will be described as an organic light-emitting display panel. The input-sensing part ISP may be disposed on the display panel DP.

The input-sensing part ISP may include a plurality of sensor portions (not shown) for detecting external inputs in a capacitive manner. The input-sensing part ISP may be manufactured directly on the display panel DP in manufacturing of the display device DD. However, an embodiment of the invention is not limited thereto, and in another embodiment, the input-sensing part ISP may be manufactured as a separate panel from the display panel DP, and bonded to the display panel DP by an adhesive layer.

The anti-reflection layer RPL may be disposed on the input-sensing part ISP. The anti-reflection layer RPL may be directly formed on the input-sensing part ISP, or bonded to the input-sensing part ISP by an adhesive layer. The anti-reflection layer RPL may be defined as an external light reflection protection film. The anti-reflection layer RPL may reduce the reflectance for external light incident from above the display device DD toward the display panel DP.

When the external light directed toward the display panel DP is reflected on the display panel DP and provided back to a use in the outside, the user may view the external light, as in a mirror. To prevent such phenomenon, for example, the anti-reflection layer RPL may include a plurality of color filters for displaying the same colors as pixels of the display panel DP.

The color filters may filter external light in the same colors as the pixels. In this case, the external light may be invisible to the user. However, an embodiment of the invention is not limited thereto, and the anti-reflection layer RPL may include a polarizing film for reducing the external light reflectance. The polarizing film may include a retarder and/or a polarizer.

The window WIN may be disposed on the anti-reflection layer RPL. The window WIN may be directly formed on the anti-reflection layer RPL, or bonded to the anti-reflection layer RPL by an adhesive layer. The window WIN may protect the display panel DP, the input-sensing part ISP, and the anti-reflection layer RPL from external scratches and impact.

The panel protection film PF may be disposed under the display panel DP. The panel protection film PF may be directly formed under the display panel DP, or bonded to the display panel DP by an adhesive layer. The panel protection film PF may protect a lower part of the display panel DP. The panel protection film PF may include a flexible plastic material such as polyethylene terephthalate ("PET").

Figure 6:
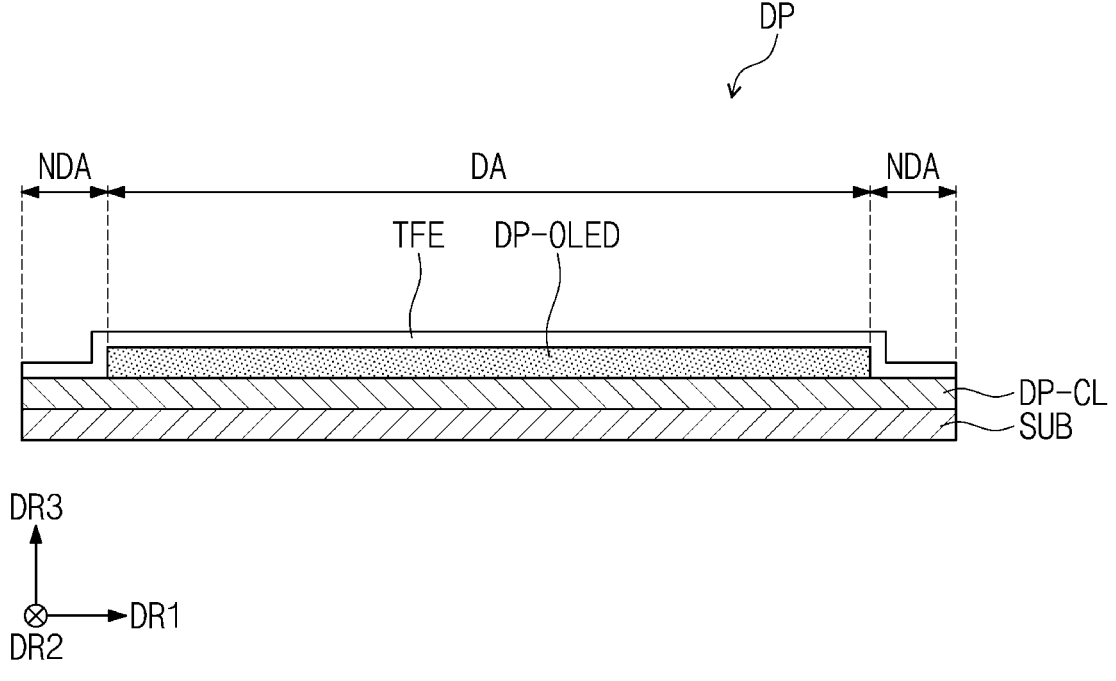
FIG. 6 is a cross-sectional view of a display panel according to an embodiment of the invention.

FIG. 6 is a drawing exemplarily illustrating a cross-section of the display panel DP illustrated in FIG. 5.

As an example, FIG. 6 illustrates a cross-section of the display panel DP viewed from a second direction DR2.

Referring to FIG. 6, the display panel DP may include a substrate SUB, a circuit element layer DP-CL disposed on the substrate SUB, a display element layer DP-OLED disposed on the circuit element layer DP-CL, and a thin-film encapsulation layer TFE disposed on the display element layer DP-OLED.

The substrate SUB may include a display region DA and a non-display region NDA around the display region DA. The substrate SUB may include a flexible plastic material such as polyimide ("PI"). The display element layer DP-OLED may be disposed on the display region DA.

A plurality of pixels may be disposed in the display region DA. The pixels may each be connected to a transistor disposed on the circuit element layer DP-CL, and include a light-emitting element disposed on the display element layer DP-OLED.

The thin-film encapsulation layer TFE may be disposed on the circuit element layer DP-CL to cover the display element layer DP-OLED. The thin-film encapsulation layer TFE may include inorganic layers and an organic layer disposed between the inorganic layers. The inorganic layers may protect the pixels from moisture/oxygen. The organic layer may protect the pixels PX from foreign substances such as dust particles.

Figure 7:
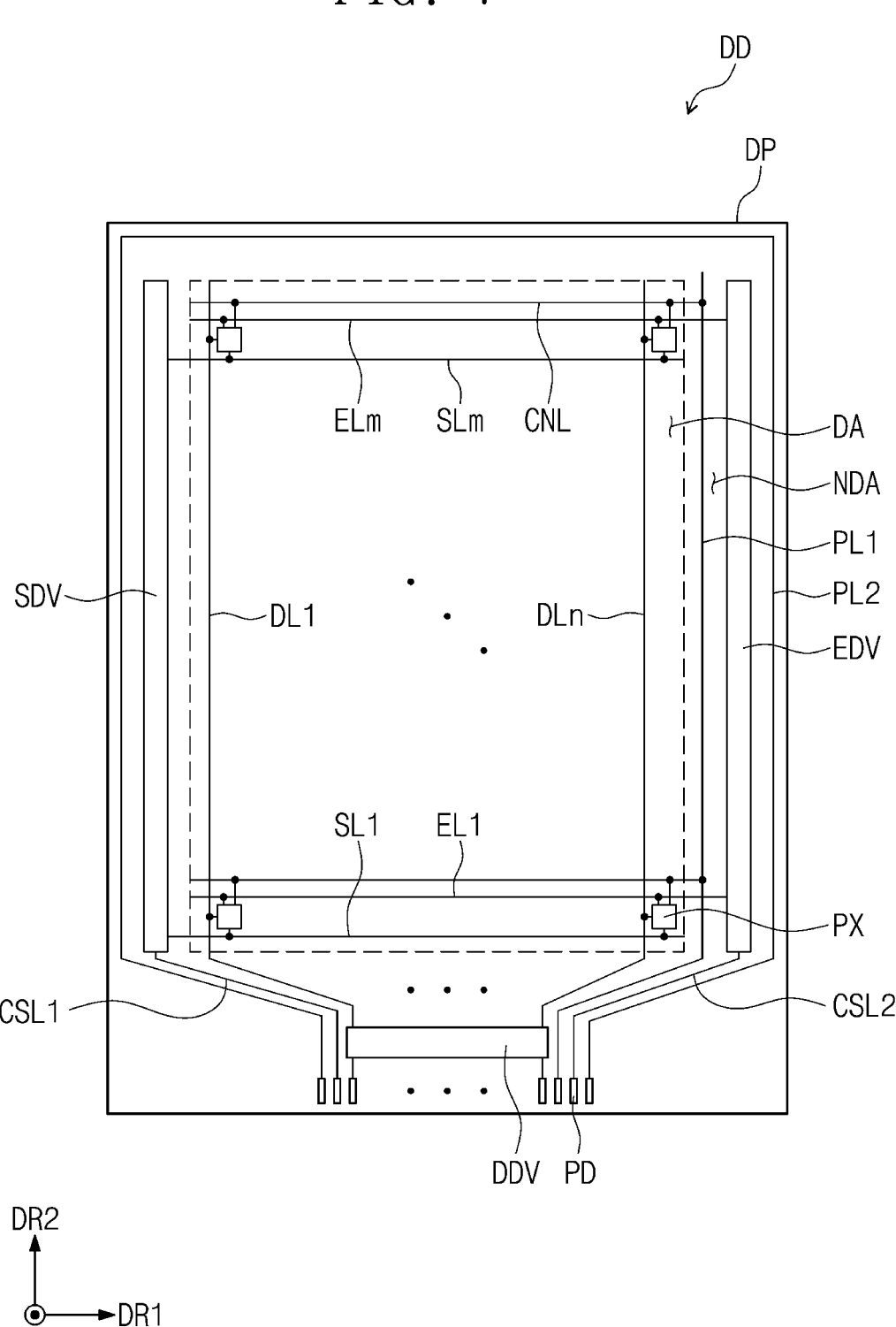
FIG. 7 is a plan view of a display panel according to an embodiment of the invention.

FIG. 7 is a plan view of the display panel illustrated in FIG. 6.

Referring to FIG. 7, a display device DD may include a display panel DP, a scan driver SDV, a data driver DDV, an emission driver EDV, and a plurality of pads PD.

The display panel DP may include a display region DA and a non-display region NDA surrounding the display region DA. The display panel DP may have a rectangular shape including long sides extending in a second direction DR2, and short sides extending in a first direction DR1, but the shape of the display panel DP is not limited thereto.

The display panel DP may include a plurality of pixels PX, a plurality of scan lines SL1 to SLm, a plurality of data lines DL1 to DLn, a plurality of emission lines EL1 to Elm, first and second control lines CSL1 and CSL2, first and second power lines PL1 and PL2, and connection lines CNL. m and n are natural numbers.

The pixels PX may be disposed in the display region DA. The scan driver SDV and the emission driver EDV may be disposed in the non-display region NDA adjacent to each of the long sides of the display panel DP. The data driver DDV may be disposed in the non-display region NDA adjacent to any one short side among the short sides of the display panel DP. When viewed on a plane, the data driver DDV may be adjacent to a lower end of the display panel DP.

The scan lines SL1 to SLm may extend in the first direction DR1 to be connected to the pixels PX and the scan driver SDV. The data lines DL1 to DLn may extend in the second direction DR2 to be connected to the pixels PX and the data driver DDV. The emission lines EL1 to Elm may extend in the first direction DR1 to be connected to the pixels PX and the emission driver EDV.

The first power line PL1 may extend in the second direction DR2 and may be disposed in the non-display region NDA. The first power line PL1 may be disposed between the display region DA and the emission driver EDV. However, an embodiment of the invention is not limited thereto, and in another embodiment, the first power line PL1 may be disposed between the display region DA and the scan driver SDV.

The connection lines CNL may extend in the first direction DR1 and may be arranged in the second direction DR2. The connection lines CNL may be connected to the first power line PL1 and the pixels PX. A first voltage may be applied to the pixels PX through the first power line PL1 and the connection lines CNL that are connected to each other.

The second power line PL2 may be disposed in the non-display region NDA. The second power line PL2 may extend along the long sides of the display panel DP and the short side of the display panel DP on which the data driver DDV is not disposed. The second power line PL2 may be disposed more outward than the scan driver SDV and the emission driver EDV.

Although not illustrated in the drawing, the second power line PL2 may extend toward the display region DA and may be connected to the pixels PX. A second voltage the level of which is lower than the level of the first voltage may be applied to the pixels PX through the second power line PL2.

The first control line CSL1 may be connected to the scan driver SDV, and may extend toward the lower end of the display panel DP when viewed on a plane. The second control line CSL2 may be connected to the emission driver EDV, and when viewed on a plane, may extend toward the lower end of the display panel DP. The data driver DDV may be disposed between the first control line CSL1 and the second control line CSL2.

The pads PD may be disposed on the display panel DP. The pads PD may be more adjacent to the lower end of the display panel DP than the data driver DDV. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DLn.

Although not illustrated in the drawing, the display device DD may further include a timing controller for controlling operations of the scan driver SDV, the data driver DDV, and the emission driver EDV, and a voltage generator for generating the first and second voltages. The timing controller and the voltage generator may be connected to the corresponding pads PD through a printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

The pixels PX may receive data voltages in response to the scan signals. The pixels PX may emit light of brightness corresponding to the data voltages in response to the emission signals, and may thus display an image. The emitting time of the pixels PX may be controlled by the emission signals.

Figure 8A:
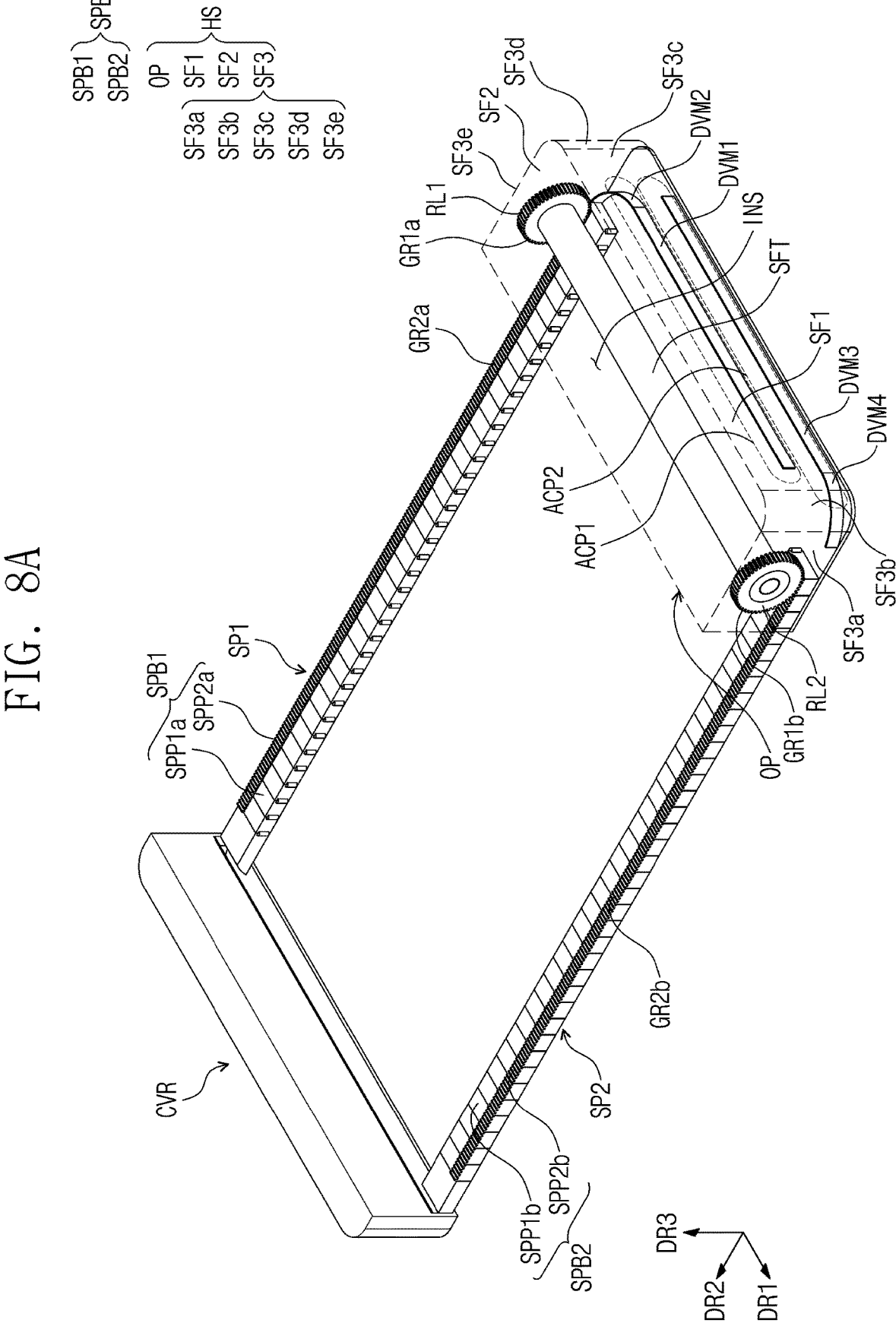
FIGS. 8A to 8C are perspective views of a display device according to an embodiment of the invention.
Figure 8B:
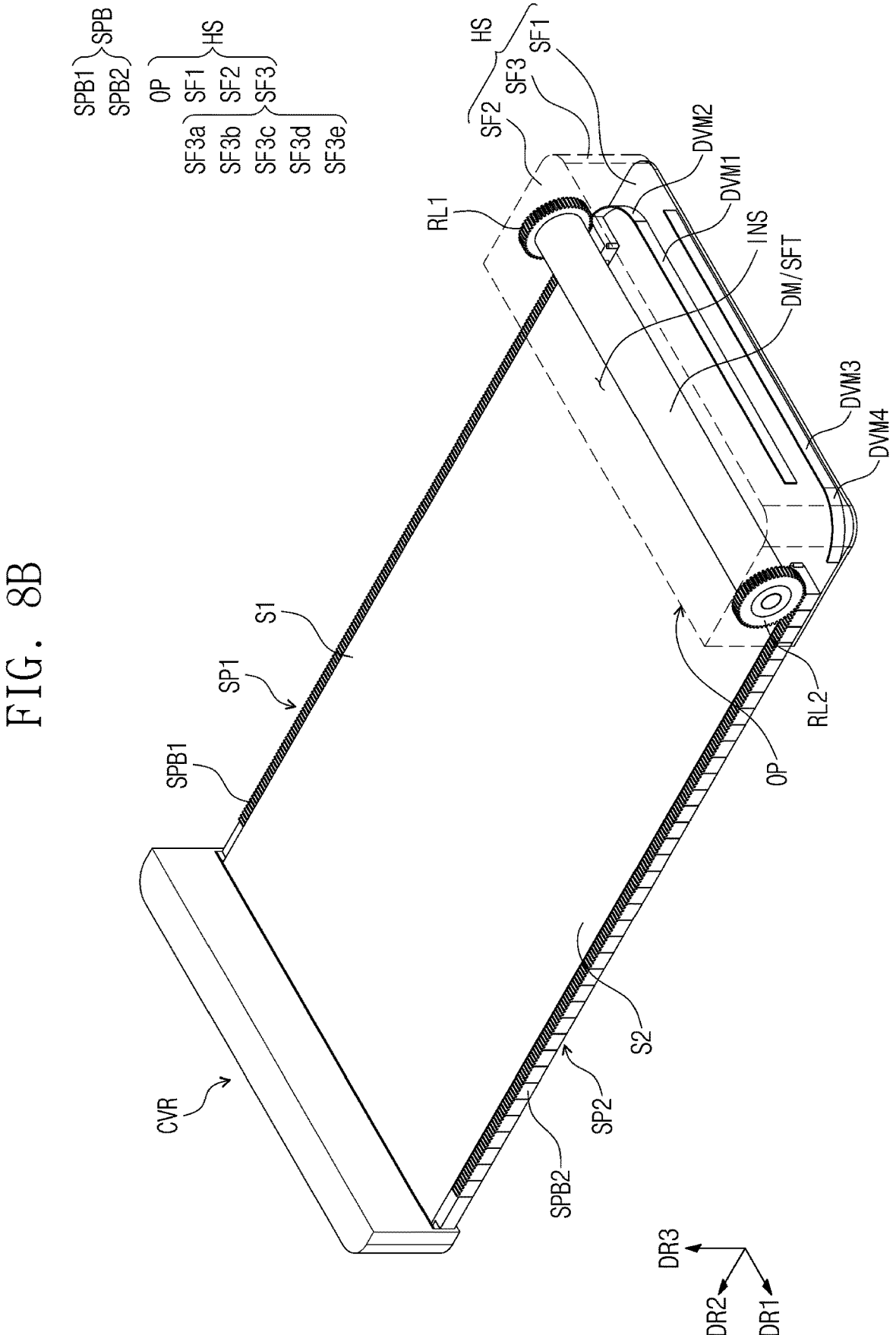
Figure 8C:
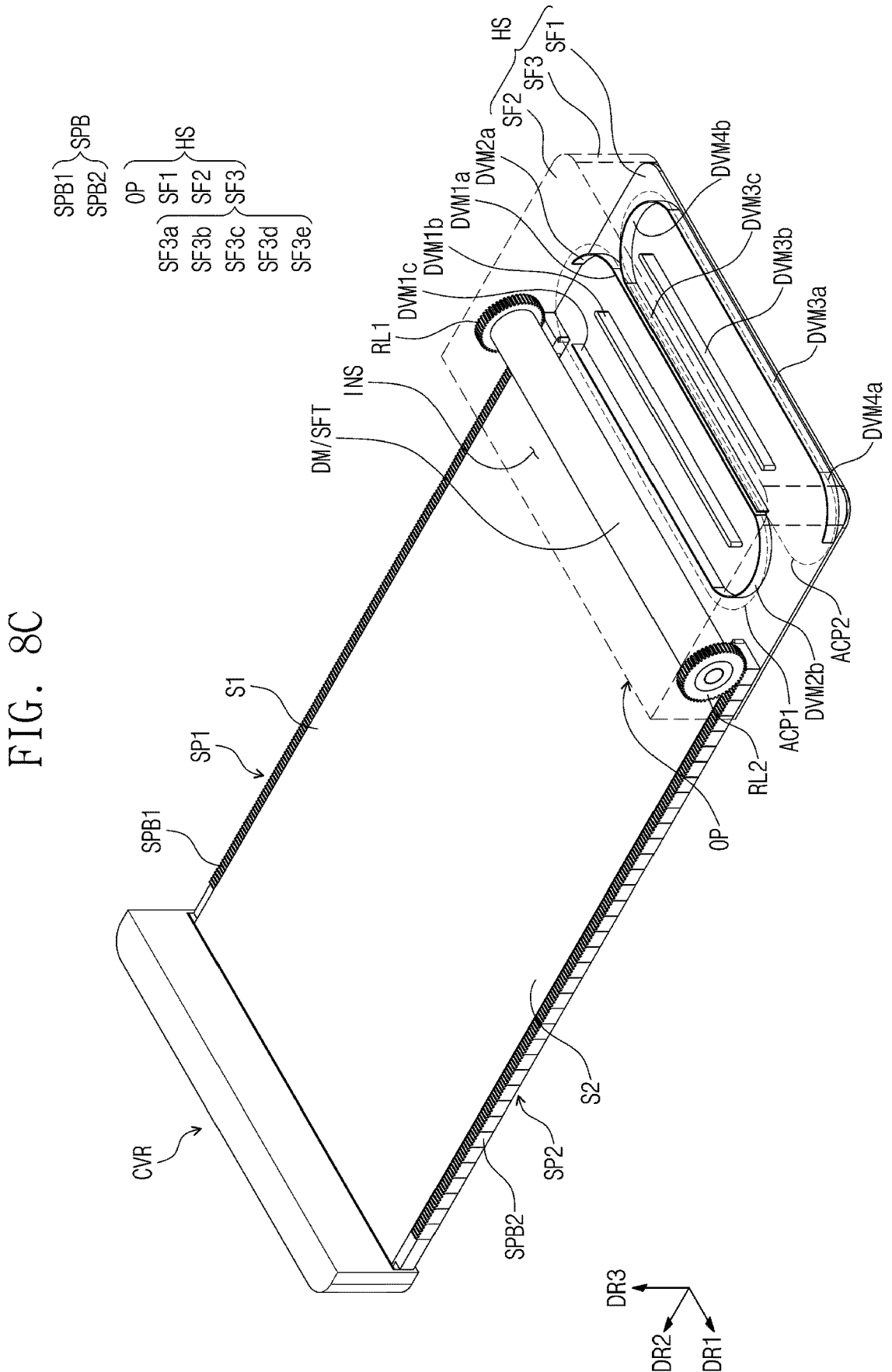

FIGS. 8A to 8C are perspective views of a display device according to an embodiment of the invention. In particular, FIG. 8A is a perspective view of a display device in a state where a display module DM is omitted, FIG. 8B is a perspective view of a display device in a state where a display module DM is not omitted, and FIG. 8C is a perspective view of a display device according to a different embodiment of the invention from the display device according to the embodiment of the invention in FIG. 8A. FIG. 8B illustrates a second state where a display module DM is unwound from a shaft SFT and exposed.

Referring to FIGS. 8A and 8B, a display device according to an embodiment of the invention may include a housing HS, a display module DM, a shaft SFT, a first roller RL1, a second roller RL2, a first supporting part SP1, a second supporting part SP2, a first accommodation part ACP1, and a second accommodation part ACP2.

The housing HS may include a plurality of surfaces, and an entrance part OP may be defined on a portion of the plurality of surfaces. In particular, the housing HS may include a first surface SF1, a second surface SF2, a plurality of connection surfaces SF3a, SF3b, SF3c, SF3d, and SF3e, and the entrance part OP.

The first surface SF1 may be parallel to a first direction DR1 and a second direction DR2. The second surface SF2 may be opposed to the first surface SF1 in a third direction DR3 crossing the first direction DR1 and the second direction DR2. The plurality of connection surfaces SF3a, SF3b, SF3c, SF3d, and SF3e may connect the first surface SF1 and the second surface SF2 together and define an inner space INS. As illustrated in the drawing, at least some surfaces SF3b and SF3d of the plurality of connection surfaces SF3a, SF3b, SF3c, SF3d, and SF3e may each be a curved surface including a curve, and the remaining surfaces SF3a, SF3c, and SF3e may be flat surfaces. However, an embodiment of the invention is not limited thereto, and in another embodiment, the plurality of connection surfaces SF3a, SF3b, SF3c, SF3d, and SF3e may be provided as flat surfaces, and are not limited to any one embodiment of the invention.

The third surface SF3 may include the plurality of connection surfaces SF3a, SF3b, SF3c, SF3d, and SF3e. The third surface SF3 may connect the first surface SF1 and the second surface SF2 together, and define the inner space INS.

The housing HS illustrated in FIG. 8A may be the same as the housing HS (see FIG. 2) previously described with reference to FIG. 2. However, an embodiment of the invention is not limited to what are illustrated in FIGS. 2 and 8A, and the housing HS may be provided in various forms.

The shaft SFT may be accommodated in the inner space INS. The shaft SFT may extend along the first direction DR1. The shaft SFT may rotate about the first direction DR1. The display module DM previously described may be wound around or unwound from the shaft SFT according to the rotation of the shaft SFT. The shaft SFT may be rotated by the rollers RL1 and RL2 to be described later, and rotated according to extension or shrink of the supporting parts SP1 and SP2 in the second direction DR2.

For example, a drawn-in and -out direction of the display module DM may cross an extension direction of the shaft SFT, and the drawn-in and -out direction of the display module DM may be an arrangement direction of supports of the supporting parts SP1 and SP2, to be described later, in the second state.

The radius of the shaft SFT may be about 35 mm or less. Alternatively, the radius of the shaft SFT may be about 20 mm or less.

The display module DM may be the display module DM previously described with reference to FIGS. 2 to 6, but an embodiment of the invention is not limited thereto, and the display module DM may be provided in various forms.

A display device in FIG. 8B, compared to the display device in FIG. 8A, may further include a display module DM. At least a portion of the display module DM may be wound around a shaft SFT. The display module DM may be wound around the shaft SFT or unwound from the shaft SFT along a rotation direction of the shaft SFT. In particular, in the first state previously described, the display module DM may be wound around the shaft SFT, and in the second state, the display module DM that has been wound around the shaft SFT may be unwound from the shaft SFT in a second direction DR2. In addition, at least a portion of the display module DM may be accommodated in an inner space INS.

The display module DM may be supported by supporting parts SP1 and SP2. In particular, the display module DM may be supported by either one of the first supporting part SP1 or the second supporting part SP2. Referring to the drawing, one side of the display module DM may be supported by the first supporting part SP1, and the other side of the display module DM may be supported by the second supporting part SP2. In particular, one side of the display module DM may be supported by a plurality of first supports SPB1 of the first supporting part SP1, and the other side (i.e., opposite side) of the display module DM may be supported by a plurality of second supports SPB2 of the second supporting part SP2.

The shrink and extension of the first supporting part SP1 and the second supporting part SP2 in the second direction DR2 in the first state may be different from those in the second state. In the first state, the first supporting part SP1 and the second supporting part SP2 may shrink in the second direction DR2, and in the second state, the first supporting part SP1 and the second supporting part SP2 may extend in the second direction DR2.

In particular, in the second state, the supports of the first supporting part SP1 and the supports of the second supporting part SP2 may be arranged in a direction crossing the extension direction of the shaft SFT to support the display module DM. In addition, in the first state, the supports of the first supporting part SP1 and the supports of the second supporting part SP2 may be arranged along a direction different from the extension direction of the shaft SFT. That is, in the second state, the arrangement direction of the supports of the first supporting part SP1 may be different from the arrangement direction of the supports of the second supporting part SP2. In the first state, the supports of the first supporting part SP1 and the supports of the second supporting part SP2 may be accommodated in the inner space INS.

According to an embodiment of the invention, at least one of the display module DM or the supporting part SP1 or SP2 may include a magnetic substance. Since the display module DM and the supporting part SP1 or SP2 include the magnetic substances, the display module DM and the supporting part SP1 or SP2 may be in close contact with each other through magnetic forces generated between the display module DM and the supporting part. Alternatively, the magnetic substance may be disposed under the display module DM, and included in the supporting part SP1 or SP2, and is not limited to any one embodiment of the invention.

The first supporting part SP1 and the second supporting part SP2 may include the plurality of supports SPB1 and SPB2, respectively. For example, the first supporting part SP1 may include the plurality of first supports SPB1, and the second supporting part SP2 may include the plurality of second supports SPB2. The first supports SPB1 and the second supports SPB2 may be provided in the same shape while different from each other in arrangement position and arrangement manner, but an embodiment of the invention is not limited thereto. The first supports SPB1 and the second supports SPB2 may be provided in various shapes, and the shape is not limited to any one embodiment of the invention. The display module DM and the first supports SPB1 or the second supports SPB2 may include magnetic substances.

Referring to the drawing, in the second state, the first supports SPB1 may be arranged along the second direction DR2, and the second supports SPB2 may be arranged along the second direction DR2.

The first supporting part SP1 and the second supporting part SP2 may each be drawn out or drawn in through an entrance part OP. The first supporting part SP1 and the second supporting part SP2 may each be accommodated in the inner space INS through the entrance part OP. For example, the first supporting part SP1 may be accommodated in the first accommodation part ACP1 while being drawn into the housing HS, and the second supporting part SP2 may be accommodated in the second accommodation part ACP2 while being drawn into the housing HS.

According to an embodiment of the invention, in the first state where the display module DM is wound around the shaft SFT, the first supporting part SP1 and the second supporting part SP2 may shrink in the second direction DR2 to be accommodated in the housing HS, and in the second state where the display module DM is unwound from the shaft SFT and drawn out of the housing HS to be exposed, the first supporting part SP1 and the second supporting part SP2 may extend in the second direction DR2 to support the display module DM.

In the first state, the first supporting part SP1 may be accommodated in the first accommodation part ACP1 in the inner space INS, and the second supporting part SP2 may be accommodated in the second accommodation part ACP2 in the inner space INS. In other words, the first supports SPB1 of the first supporting part SP1 may be accommodated in the first accommodation part ACP1, and the second supports SPB2 of the second supporting part SP2 may be accommodated in the second accommodation part ACP2. This will be described in detail later with reference to FIGS. 10A to 10C.

Referring to the drawing, in the second state, the first supports SPB1 may be arranged along the second direction DR2, and the second supports SPB2 may be arranged along the second direction DR2.

The first supports SPB1 may include a first supporting portion SPP1*a* and a second supporting portion SPP2*a*, and the second supports SPB2 may include a first supporting portion SPP1*b* and a second supporting portion SPP2*b*. Each of the first supporting portions SPP1*a* and SPP1*b* may overlap the display module DM, and each of the second supporting portions SPP2*a* and SPP2*b* may not overlap the display module DM in a plan view. For example, the first supporting portions SPP1*a* of the first supports SPB1 and the first supporting portions SPP1*b* of the second supports SPB2 may support the display module DM, the second supporting portions SPP2*a* of the first supports SPB1 may be in contact with the first roller RL1, and the second supporting portions SPP2*b* of the second supports SPB2 may be in contact with the second roller RL2.

The first roller RL1 and the second roller RL2 may be coupled to the shaft SFT. For example, the first roller RL1 may be coupled to one side of the shaft SFT, and the second roller RL2 may be coupled to the other side of the shaft SFT. The first roller RL1 and the second roller RL2 may be spaced apart from each other in the first direction DR1. The first roller RL1 and the second roller RL2 may each rotate about the first direction DR1. The first roller RL1 and the second roller RL2 may each extend along the first direction DR1.

The first roller RL1 and the second roller RL2 may rotate according to shrink or extension of the first supporting part SP1 and the second supporting part SP2 in the second direction DR2. The first roller RL1 and the second roller RL2 may be in contact with the first supporting part SP1 and the second supporting part SP2, respectively. By the contact of the first roller RL1 with the first supporting part SP1, and by the contact of the second roller RL2 with the second supporting part SP2, the first roller RL1 and the second roller RL2 may rotate according to the shrink or extension of the first supporting part SP1 and the second supporting part SP2 in the second direction DR2, respectively. For example, a straight-line motion of the first supporting part SP1 may be changed to a rotational motion of the first roller RL1 due to an engaging structure (for example, a gearing structure) of the first roller RL1 and the first supporting part SP1. However, an embodiment of the invention is not limited thereto, and in another embodiment, the straight-line motion of the first supporting part SP1 may be changed to the rotational motion of the first roller RL1 through magnetic forces applied between the first roller RL1 and the first supporting part SP1, and the changing of motion is not limited to any one embodiment of the invention. The description above may equally apply to the second roller RL2 and the second supporting part SP2.

According to an embodiment of the invention, the first roller RL1 and the second roller RL2 may rotate according to the first supporting part SP1 and the second supporting part SP2, respectively, being drawn in or drawn out of the housing HS. In particular, according to movement of the cover CVR (see FIG. 2), the first supports SPB1 of the first supporting part SP1 or the second supports SPB2 of the second supporting part SP2 may each be drawn in or out of the housing HS.

In such a relationship between the first supporting part SP1 and the first roller RL1, and a relationship between the second supporting part SP2 and the second roller RL2, the straight-line motions of the supporting parts SP1 and SP2 may be changed to the rotational motions of the rollers RL1 and RL2, respectively. Through this, a separate power unit for rotating the shaft SFT is not additionally required, and thus microminiaturization of the display device may be facilitated. For example, the external diameter of the shaft SFT may be reduced.

However, to facilitate the rotation of the shaft SFT, a separate power unit, etc. may be provided to the inside of the housing HS or the outside of the housing HS, and is not limited to any one embodiment of the invention.

The first roller RL1 and the second roller RL2 may be coupled to the shaft SFT, and at this time, the shaft SFT may also rotate along the rotations of the first roller RL1 and the second roller RL2. According to the rotation of the shaft SFT, the display module DM may be would around or unwound from the shaft SFT. At this time, whether the display module DM is wound around the shaft SFT or unwound from the shaft SFT depends on whether the first supports SPB1 and the second supports SPB2 are drawn into the housing HS or drawn out of the housing HS. For example, when the first supports SPB1 and the second supports SPB2 are drawn into the housing HS, the rollers RL1 and RL2 may rotate, and the display module DM may be wound around the shaft SFT. When the first supports SPB1 and the second supports SPB2 are drawn out of the housing HS, the rollers RL1 and RL2 may rotate, and the display module DM may be unwound from the shaft SFT. That is, according to the rotations of the first roller RL1 and the second roller RL2 due to the first supports SPB1 and the second supports SPB2 being drawn in or out, the display module DM may be wound around or unwound from the shaft SFT, thereby being accommodated in the inner space INS or exposed to the outside of the inner space INS.

The housing HS may include the first accommodation part ACP1 and the second accommodation part ACP2. The first accommodation part ACP1 and the second accommodation part ACP2 may be defined in the inner space INS of the housing HS. The first accommodation part ACP1 and the second accommodation part ACP2 may be spaced apart from each other. The first supporting part SP1 may be accommodated in the first accommodation part ACP1, and the second supporting part SP2 may be accommodated in the second accommodation part ACP2.

According to an embodiment of the invention, the first supporting part SP1 may be arranged along the first accommodation part ACP1, and the second supporting part SP2 may be arranged along the second accommodation part ACP2. In particular, the first supports SPB1 of the first supporting part SP1 may be arranged along the first accommodation part ACP1, and the second supports SPB2 of the second supporting part SP2 may be arranged along the second accommodation part ACP2.

Some of the first supports SPB1 may be arranged in the same direction in the first accommodation part ACP1, and the rest of the first supports SPB1 may be arranged in different directions. In the second accommodation part ACP2, some of the second supports SPB2 may be arranged in the same direction, and the rest of the second supports SPB2 may be arranged in different directions. The arrangements of the first supports SPB1 in the first accommodation part ACP1 and the second supports SPB2 in the second accommodation part ACP2 will be described later with reference to FIGS. 10A to 10C.

The first accommodation part ACP1 and the second accommodation part ACP2 may be disposed on the same surface. Referring to the drawing, the first accommodation part ACP1 and the second accommodation part ACP2 may be disposed on the first surface SF1. However, an embodiment of the invention is not limited thereto, and in another embodiment, the first accommodation part ACP1 and the second accommodation part ACP2 may be disposed on the third surface SF3, and the position is not limited to any one embodiment of the invention.

The first accommodation part ACP1 and the second accommodation part ACP2 may be disposed apart, with respect to the shaft SFT, by the distances that are different from each other. Referring to the drawing, the second accommodation part ACP2 may be disposed further apart from the shaft SFT with the first accommodation part ACP1 therebetween. However, an embodiment of the invention is not limited to what is illustrated in the drawing, and the first accommodation part ACP1 may be disposed further apart from the shaft SFT with the second accommodation part ACP2 therebetween, and the arrangement thereof is not limited to any one embodiment of the invention. In addition, the first accommodation part ACP1 and the second accommodation part ACP2 may be disposed apart, with respect to the shaft SFT, by the same distance to each other.

The first accommodation part ACP1 may be defined by a first division member DVM1 and a second division member DVM2. An extension direction of the first division member DVM1 and an extension direction of the second division member DVM2 may be different from each other.

Referring to the drawing, the first division member DVM1 may extend along the first direction DR1, and the second division member DVM2 may be connected to one side of the first division member DVM1. In addition, the second division member DVM2 may extend along a direction different from the first direction DR1. For example, the second division member DVM2 may extend along the second direction DR2. However, an embodiment of the invention is not limited thereto, and in another embodiment, a portion of the second division member DVM2 may extend along the second direction DR2, the other portion may extend along the first direction DR1, and a portion thereof may be bent.

The first supports SPB1 may be arranged along the first division member DVM1 and the second division member DVM2. Details will be described later with reference to FIG. 10B.

The second accommodation part ACP2 may be defined by a third division member DVM3 and a fourth division member DVM4. An extension direction of the third division member DVM3 and an extension direction of the fourth division member DVM4 may be different from each other. Referring to the drawing, the third division member DVM3 may extend along the first direction DR1, and the fourth division member DVM4 may be connected to one side of the third division member DVM3. In addition, the fourth division member DVM4 may extend in a direction different from the first direction DR1. For example, the fourth division member DVM4 may extend along the second direction DR2. However, an embodiment of the invention is not limited thereto, and in another embodiment, a portion of the fourth division member DVM4 may extend along the second direction DR2, the other portion may extend along the first direction DR1, and a portion thereof may be bent.

The first division member DVM1 and the third division member DVM3 may be provided to correspond to each other. The second division member DVM2 and the fourth division member DVM4 may be provided to correspond to each other. For example, the first division member DVM1 and the third division member DVM3 may be identical in shape, width, length, etc., but may be different only in the arrangement position, and the second division member DVM2 and the fourth division member DVM4 may also be identical in shape, width, length, etc., but may be different only in the arrangement position. However, an embodiment of the invention is not limited thereto, and the first to fourth division members DVM1, DVM2, DVM3, and DVM4 may have variously different shapes, or widths and lengths.

The first supports SPB1 may be arranged along the first division member DVM1 and the second division member DVM2, and the second supports SPB2 may be arranged along the third division member DVM3 and the fourth division member DVM4. Details will be described later with reference to FIG. 10.

Referring to FIG. 8C, the division members DVM1, DVM2, DVM3, and DVM4 (see FIG. 8B) may each be provided in plurality. Since each of the division members DVM1, DVM2, DVM3, and DVM4 (see FIG. 8B) are provided in plurality, utilization of space may be increased for the relationship not only between the supports SPB1 and SPB2, but also between other components in the housing HS.

The first and second division members DVM1 and DVM2 (see FIG. 8B) may each be provided in plurality. The plurality of first and second division members DVM1 and DVM2 (see FIG. 8B) may be alternately disposed along the arrangement direction of the supports SPB1. The second division members DVM2 (see FIG. 8B) may connect the first division members DVM1 (see FIG. 8B) that are spaced apart from each other. In particular, the first division members DVM1a, DVM1b, and DVM1c may extend along the first direction DR1, and the second division members DVM2a, and DVM2b may each extend in a direction different from the first direction DR1, and may be connected to the first division members DVM1a and DVM1c. A portion of each of the second division members DVM2a and DVM2b may be bent. At least one of the second division members DVM2a and DVM2b may be disposed between the adjacent first division members among the first division members DVM1a, DVM1b, and DVM1c.

The third and fourth division members DVM3 and DVM4 (see FIG. 8B) may each be provided in plurality. The plurality of third and fourth division members DVM3 and DVM4 (see FIG. 8B) may be alternately disposed along the arrangement direction of the supports SPB2. The fourth division members DVM4 (see FIG. 8B) may connect the third division members DVM3 that are spaced apart from each other. In particular, the third division members DVM3a, DVM3b, and DVM3c may extend along the first direction DR1, and the fourth division members DVM4a and DVM4b may each extend in a direction different from the first direction DR1, and may be connected to the third division members DVM3a and DVM3c. A portion of each of the fourth division members DVM4a and DVM4b may be bent. At least one of the fourth division members DVM4a and DVM4b may be disposed between the adjacent third division members among the third division members DVM3a, DVM3b, and DVM3c.

For example, increasing a space where the supports SPB1 and SPB2 may be accommodated in the housing HS may increase the number of supports SPB1 and SPB2 which may support the display module DM in the second state, and therefore, it may be possible to accommodate the supports SPB1 and SPB2 in the housing HS in response to the increase in size of the display module DM.

In addition, for the relationship between other components, by minimizing the volumes, etc. of the first accommodation part ACP1 and the second accommodation part ACP2 where the supports SPB1 and SPB2 are accommodated, while accommodating the same number of the supports SPB1 and SPB2 in the housing HS, microminiaturization of the display device may be facilitated.

Figure 9A:
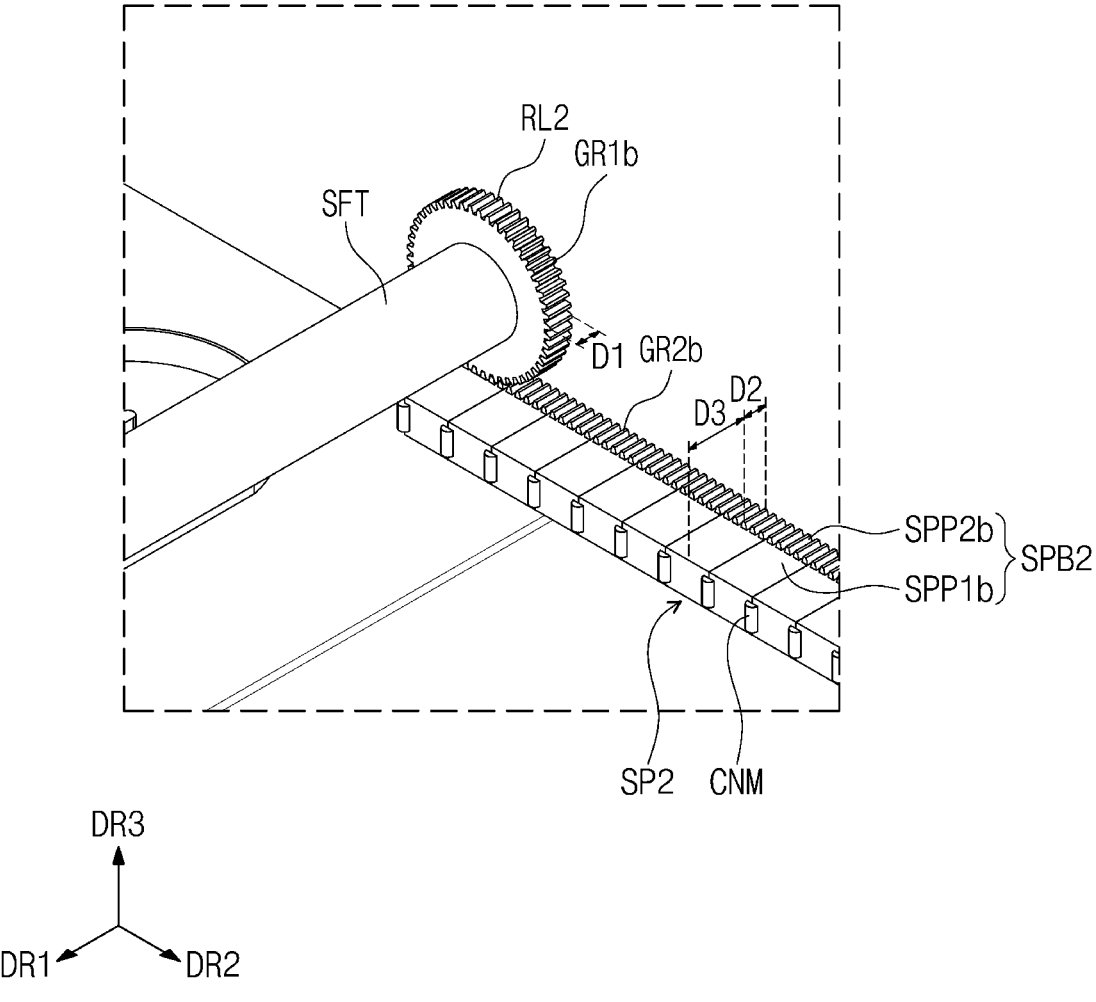
FIGS. 9A and 9B are enlarged views of a portion of a display device according to an embodiment of the invention.
Figure 9B:
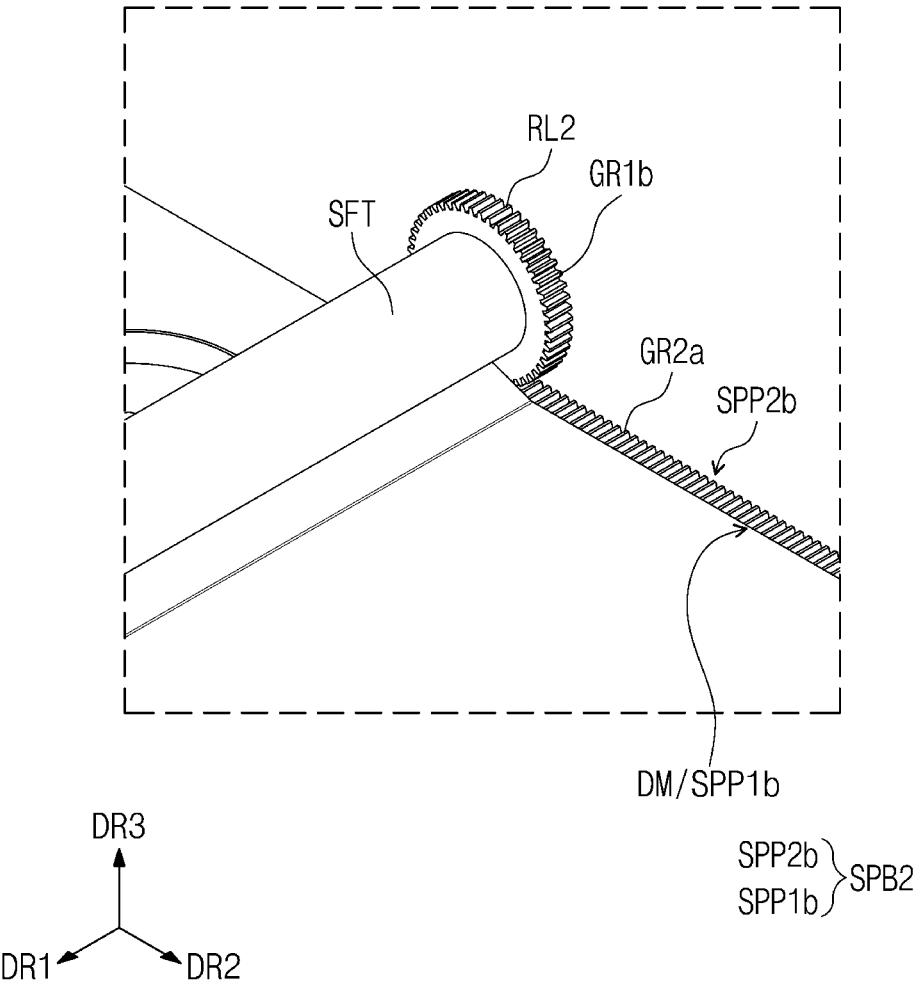

FIGS. 9A and 9B are enlarged view illustrating a portion of a display device according to an embodiment of the invention. In particular, FIG. 9A is an enlarged view illustrating a portion of the display device in FIG. 8A, and FIG. 9B is an enlarged view illustrating a portion of the display device in FIG. 8B.

Referring to FIGS. 9A and 9B, the second roller RL2 may include a first gear GR1b, and the second supports SPB2 of the second supporting part SP2 may include a second gear GR2b, and include a first supporting portion SPP1b and a second supporting portion SPP2b.

FIGS. 9A and 9B illustrate only the second roller RL2 and the second supporting part SP2, and the first roller RL1 and the first supporting part SP1 are omitted, but the description of the second roller RL2 and the second supporting part SP2 as follows may equally apply to the first roller RL1 (see FIG. 8A) and the first supporting part SP1 (see FIG. 8A). That is, like the second roller RL2, the first roller RL1 (see FIG. 8A) may also include a first gear GR1a (see FIG. 8A), and the first supports SPB1 (see FIG. 8A) of the first supporting part SP1 (see FIG. 8A) may each also include the first supporting portion SPP1a (see FIG. 8A) and the second supporting portion SPP2a (see FIG. 8A).

The first gear GR1b of the second roller RL2 may be disposed along the outer circumference of the second roller RL2. The first gear GR1b of the second roller RL2 may be engaged with the second gear GR2b of the second support SPB2. When a straight-line motion of the second support SPB2 is changed to rotational motions of the second roller RL2 and the shaft SFT, transmission of power may be facilitated by providing the first gear GR1b to the second roller RL2 and providing the second gear GR2b to the second support SPB2. Through this engaging structure of the gears, the transmission of power between the second support SPB2 and the second roller RL2 may be facilitated, and the loss of power transmitted may be reduced. This may equally apply to the first support SPB1 (see FIG. 8A) and the first roller RL1 (see FIG. 8A) as previously described.

A thickness D1 of the first gear GR1b and a thickness D2 of the second gear GR2b may be the same. However, an embodiment of the invention is not limited thereto, and in another embodiment, the thickness D2 of the second gear GR2b may be larger than the thickness D1 of the first gear GR1a, and the thickness is not limited to any one embodiment of the invention.

The second support SPB2 may include the first supporting portion SPP1b which may be in contact with the display module DM, and the second supporting portion SPP2b having the second gear. In particular, in the first state, the first supporting portion SPP1b may be in contact with the display module DM, and may support the display module DM.

The second supporting portion SPP2b of the second support SPB2 may be spaced further apart from the display module DM than the first supporting portion SPP1b. Alternatively, in a plan view, the second supporting portion SPP2b may not overlap the display module DM.

The area of the second supporting portion SPP2b may be smaller than the area of the first supporting portion SPP1b. In other words, a length D2 of the second supporting portion SPP2b in a first direction DR1 may be smaller than a length D3 of the first supporting portion SPP1b in the first direction DR1. By making the area of the second supporting portion SPP2b smaller than the area of the first supporting portion SPP1b, the area of the second supporting portion SPP2b surrounding the display module DM may be minimized. However, an embodiment of the invention is not limited thereto, and in another embodiment, the area of the first supporting portion SPP1b may be the same as the area of the second supporting portion SPP2b, and the area is not limited to any one embodiment of the invention.

The display device in FIG. 9B, compared to the display device in FIG. 9A, further includes a display module DM. At least a portion of the display module DM may be wound around the shaft SFT. In addition, the display module DM may be supported by the second supporting portion SPP2b.

Referring to the drawing, the display module DM is supported by the first supporting portion SPP1b, and is not supported by the second supporting portion SPP2b. As previously described, the second supporting portion SPP2b does not overlap the display module DM in a plan view. As the second gear GR2b of the second supporting portion SPP2b is engaged with the first gear GR1b of the second roller RL2, as previously described, the straight-line motions of the second supports SPB2 may be changed to the rotational motions of the second roller RL2 and the shaft SFT. This applies equally to the first supports SPB1 (see FIG. 8A) and the first roller RL1 previously described.

Figure 10A:
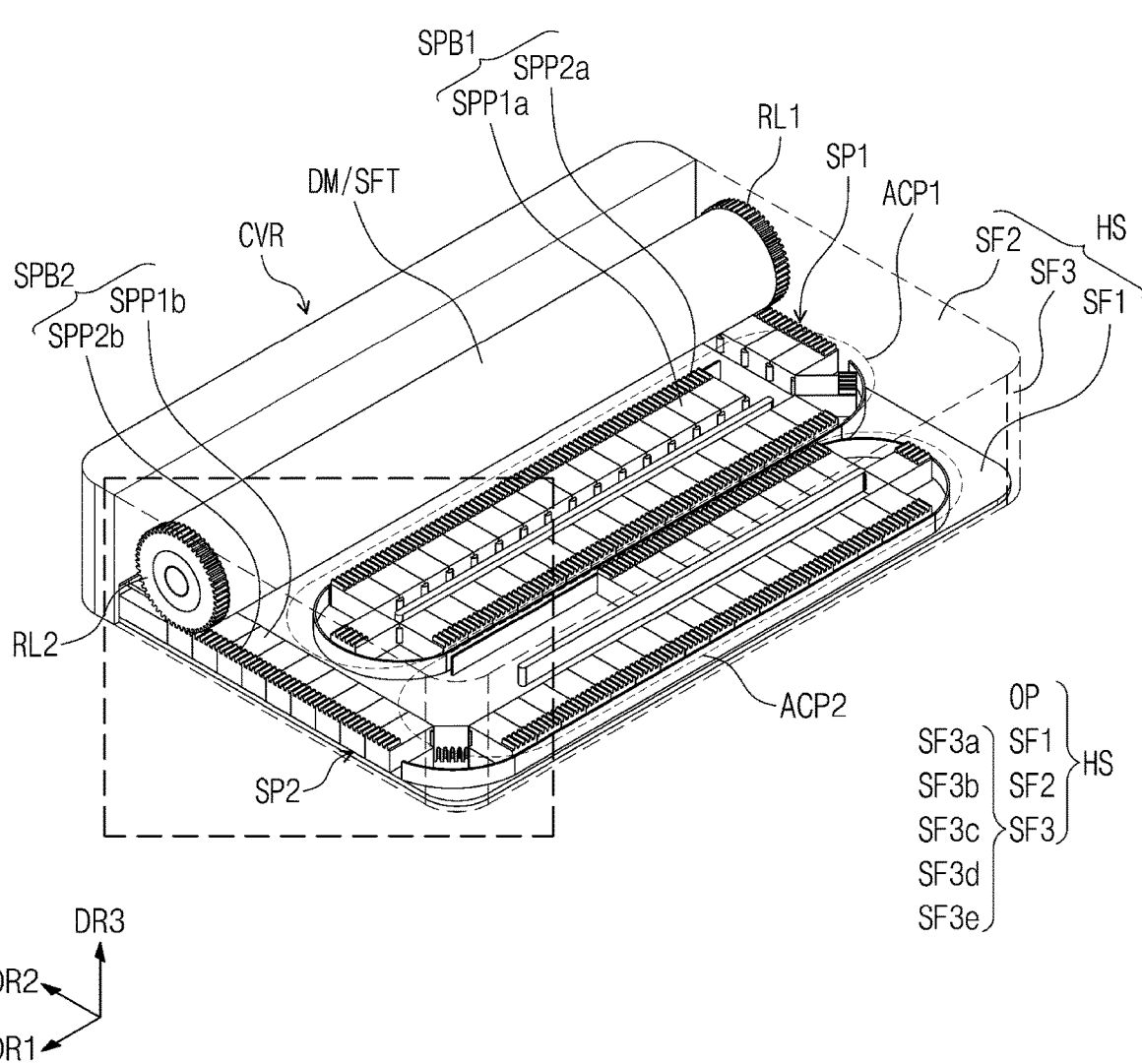
FIG. 10A is a perspective view of a display device according to an embodiment of the invention.
Figure 10B:
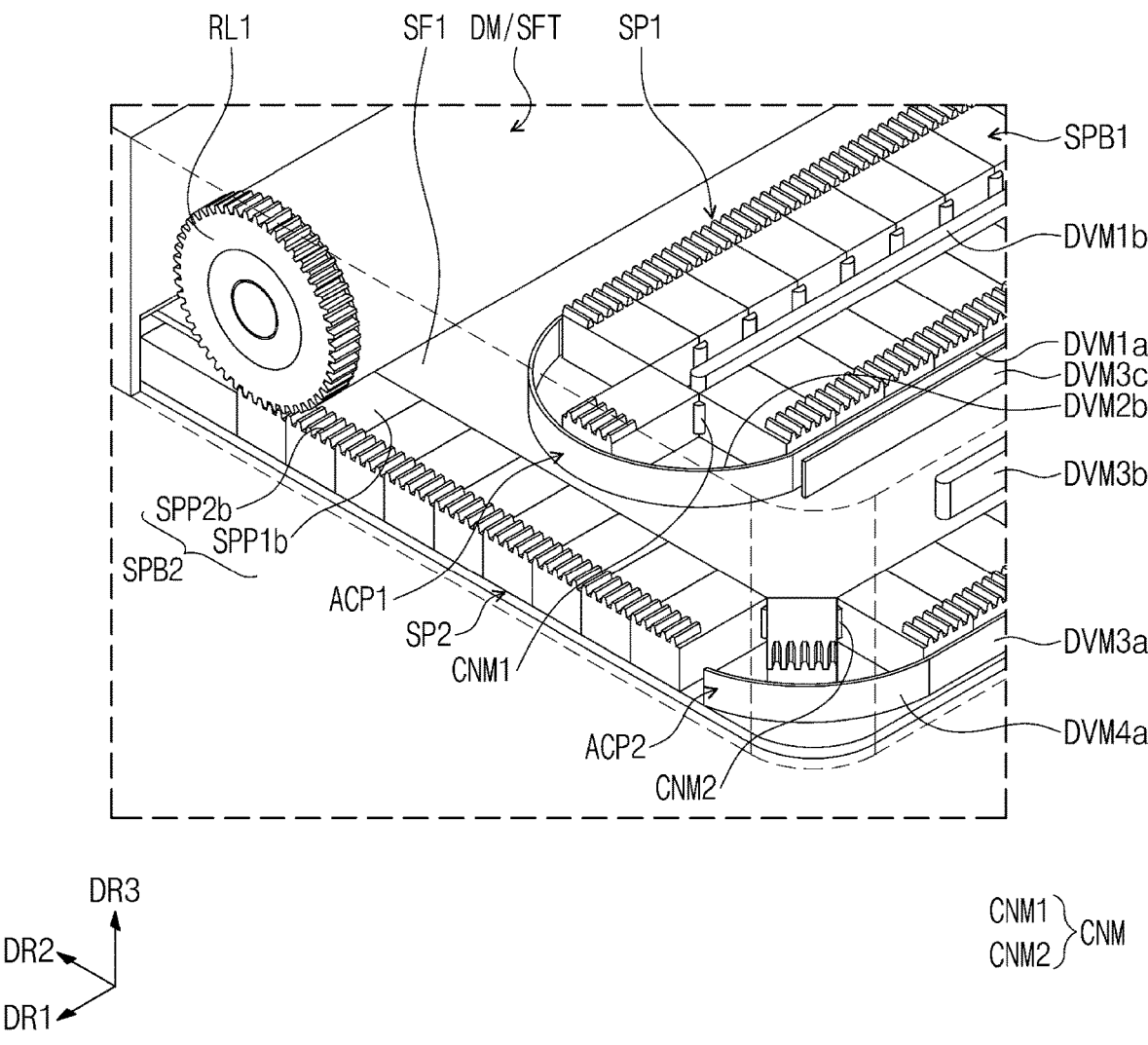
FIG. 10B is an enlarged view of a portion of a display device according to an embodiment of the invention.
Figure 10C:
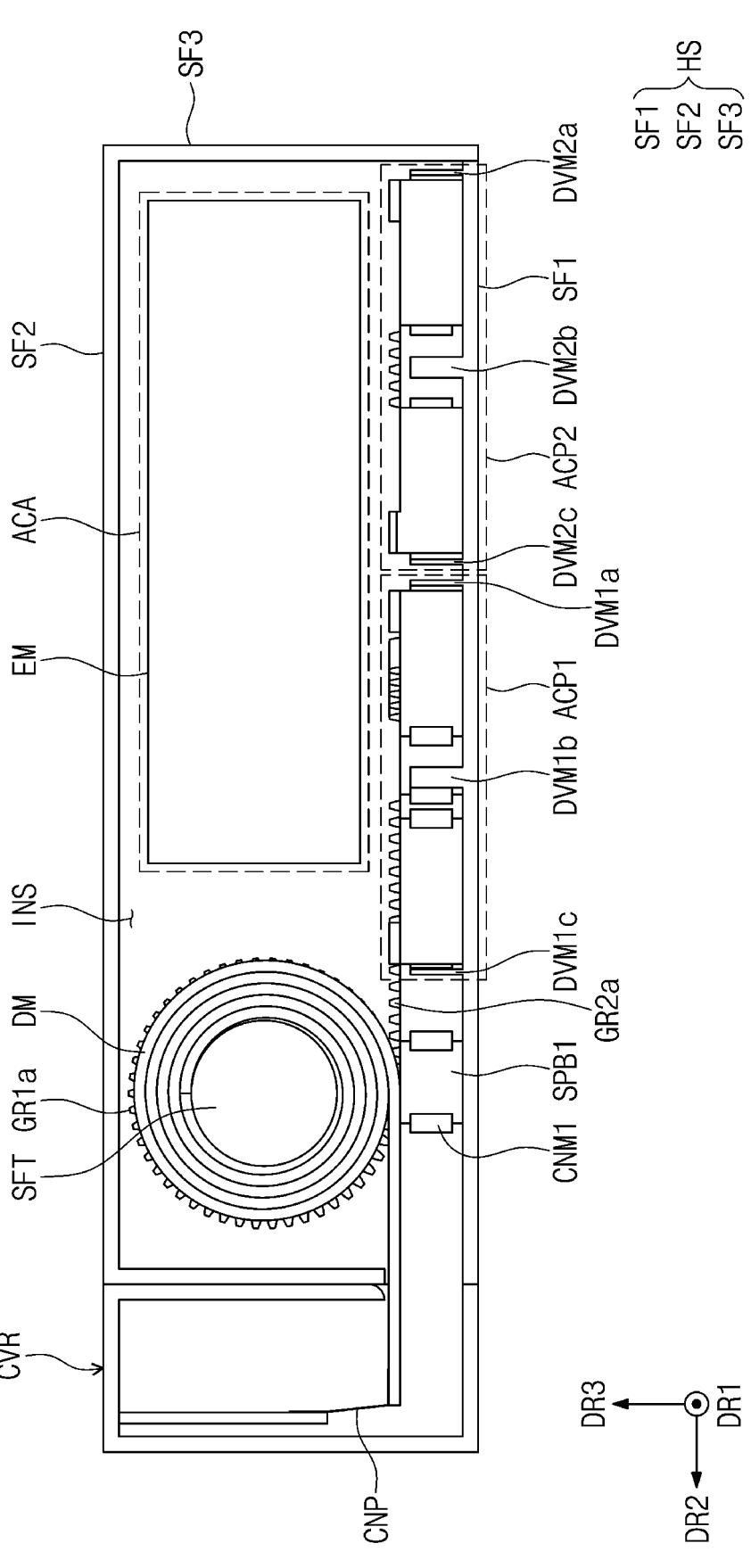
FIG. 10C is a cross-sectional view of a display device according to an embodiment of the invention.

FIG. 10A is a perspective view of a display device according to an embodiment of the invention, FIG. 10B is an enlarged view illustrating a portion of a display device according to an embodiment of the invention, and FIG. 10C is a cross-sectional view of a display device according to an embodiment of the invention. In particular, FIG. 10A is a drawing illustrating a state where supports SPB1 and SPB2 according to an embodiment of the invention are accommodated in a housing HS, FIG. 10B is an enlarged perspective view illustrating a portion of FIG. 10A, and FIG. 10C is a cross-sectional view of FIG. 10A.

FIG. 10A illustrates a first state where a display module DM is wound around a shaft SFT.

Referring to FIGS. 10A and 10B, it may be seen that a first supporting part SP1 is accommodated in a first accommodation part ACP1, and a second supporting part SP2 is accommodated in a second accommodation part ACP2.

The second accommodation part ACP2 may be disposed further apart from the shaft SFT with the first accommodation part ACP1 therebetween. In other words, the third division member DVM3 (see FIG. 8B) and the fourth division member DVM4 (see FIG. 8B) of the second accommodation part ACP2 may be spaced further apart from the shaft SFT than the first division member DVM1 (see FIG.

8B) and the second division member DVM2 (see FIG. 8B) of the first accommodation part ACP1.

The first division member DVM1 (see FIG. 8B) and the second division member DVM2 (see FIG. 8B) of the first accommodation part ACP1 may extend along different directions. First supports SPB1 may be disposed along an extension direction of the first division member DVM1 (see FIG. 8B) or an extension direction of the second division member DVM2 (see FIG. 8B). In other words, among the plurality of first supports SPB1, the first supports SPB1 arranged along the first division member DVM1 (see FIG. 8B) and the first supports SPB1 arranged along the second division member DVM2 (see FIG. 8B) may be different in arrangement direction.

The third division member DVM3 (see FIG. 8B) and the fourth division member DVM4 (see FIG. 8B) of the second accommodation part ACP2 may extend in different directions. The second supports SPB2 may be disposed along an extension direction of the third division member DVM3 (see FIG. 8B) or an extension direction of the fourth division member DVM4 (see FIG. 8B). In other words, among the plurality of second supports SPB2, the second supports SPB2 arranged along the third division member DVM3 (see FIG. 8B) and the second supports SPB2 arranged along the fourth division member DVM4 (see FIG. 8B) may be different in arrangement direction.

A coupling member CNM may couple the first supports SPB1 adjacent to each other among the first supports SPB1, and couple second supports SPB2 adjacent to each other among the second supports SPB2. The coupling member CNM may couple the first supports SPB1 adjacent to each other, or the second supports SPB2 adjacent to each other to be rotatable.

A first coupling member CNM1 may couple the first supports SPB1 adjacent to each other to be rotatable, and a second coupling member CNM2 may couple the second supports SPB2 adjacent to each other to be rotatable.

The first supports SPB1 adjacent to each other between the first division member DVM1 (see FIG. 8B) and the second division member DVM2 (see FIG. 8B) or the first supports SPB1 adjacent to each other on the second division member DVM2 may be rotatable about the first coupling member CNM1 (see FIG. 8B). Through this, it may be possible to arrange the first supports SPB1 along the first division member DVM1 (see FIG. 8B) and the second division member DVM2 (see FIG. 8B) while minimizing an empty space.

The second supports SPB2 adjacent to each other between the third division member DVM3 and the fourth division member DVM4 (see FIG. 8B) or the second supports SPB2 adjacent to each other on the fourth division member DVM4 (see FIG. 8B) may be rotatable about the second coupling member CNM2. Through this, it may be possible to arrange the second supports SPB2 along the third division member DVM3 (see FIG. 8B) and the fourth division member DVM4 (see FIG. 8B) while minimizing an empty space.

In other words, since the adjacent first supports SPB1 or the adjacent second supports SPB2 are rotatable about the first coupling member CNM1 or the second coupling member CNM2, respectively, the empty space may be minimized in the first accommodation part ACP1 or the second accommodation part ACP2, thereby improving utilization of space in a housing HS.

Referring to FIG. 10C, the housing HS according to an embodiment of the invention may include an accommodation space ACA. As illustrated in the drawing, the accommodation space ACA may be defined on the first accommodation part ACP1 or the second accommodation part ACP2, and the accommodation space ACA may be defined on the first accommodation part ACP1 and the second accommodation part ACP2.

However, an embodiment of the invention is not limited to what is illustrated in the drawing, the accommodation space ACA may be defined at the same height as the height of at least one of the first accommodation part ACP1 or the second accommodation part ACP2, and is not limited to any one embodiment of the invention.

An electronic module EM, etc. may be disposed in the accommodation space ACA. For example, the electronic module EM may be a battery, and an embodiment of the invention is not limited thereto. The electronic module EM may be provided variously, such as a circuit board and a sensor, and is not limited to any one embodiment of the invention.

In this way, by including the first accommodation part ACP1, the second accommodation part ACP2, and the accommodation space ACA, it may be possible to increase the utilization of space in the housing HS, and to facilitate microminiaturization of the product.

A cover CVR may be connected or coupled to the display module DM through a connection part CNP. The connection part CNP may fix one side of the display module DM to the cover CVR. In the drawing, it is illustrated that the connection part CNP is a fixing line (or fixing surface) for fixing one side of the display module DM to the housing, but an embodiment of the invention is not limited thereto. In another embodiment, the connection part CNP may connect or couple the components in various shapes such as a cylinder or poly-prism, and the shape is not limited to any one embodiment of the invention.

Figure 11:
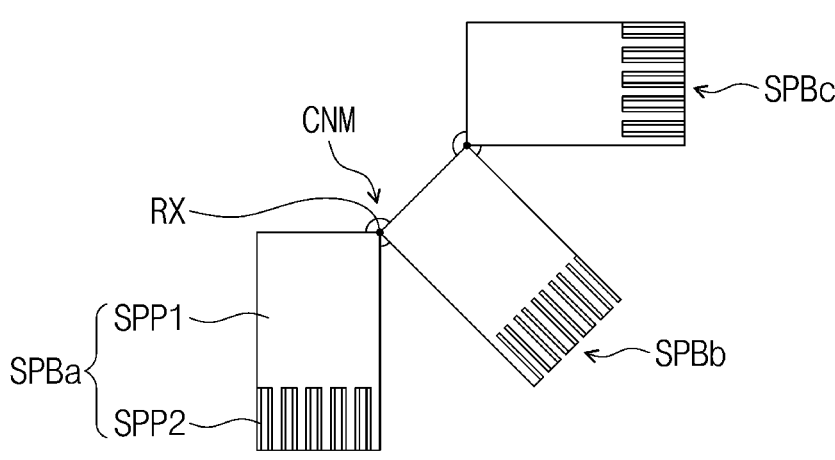
FIG. 11 is a plan view of supports according to an embodiment of the invention.

FIG. 11 is a plan view of supports according to an embodiment of the invention.

Referring to FIG. 11, a display device according to an embodiment of the invention may include a coupling member CNM for coupling supports SPBa SPBb, and SPBc adjacent to each other. The supports SPBa, SPBb, and SPBc adjacent to each other may be linked or hinged to each other through the coupling member CNM.

The coupling member CNM may be coupled to a first supporting portion SPP1 of each of the supports SPBa, SPBb, and SPBc adjacent to each other. The first supporting portions SPP1 adjacent to each other may be coupled to be rotatable about the coupling member CNM.

The supports SPBa, SPBb, and SPBc illustrated in FIG. 11 may be the first supports SPB1 (see FIG. 10B) or the second supports SPB2 (see FIG. 10B) previously described with reference to FIG. 10B. In addition, the coupling member CNM illustrated in FIG. 11 may be the first coupling member CNM1 (see FIG. 10B) or the second coupling member CNM2 (see FIG. 10B) previously described with reference to FIG. 10B.

The supports SPBa, SPBb, and SPBc adjacent to each other may be rotatable about the coupling member CNM. In particular, the supports SPBa, SPBb, and SPBc adjacent to each other may be rotatable about a central axis RX of the coupling member CNM as a rotation axis.

At this time, the degree of rotation (or rotation angle) of each of the supports SPBa, SPBb, and SPBc adjacent to each other may change according to the form of the first accommodation part ACP1 (see FIG. 10B) or the second accommodation part ACP2 (see FIG. 10B) previously described. For example, when the first accommodation part ACP1 (see FIG. 10B) or the second accommodation part ACP2 (see FIG. 10B) includes a curve or a curved surface, the degree of rotation of each of the supports SPBa, SPBb, and SPBc adjacent to each other may correspond to the curve or the curved surface. In other words, in correspondence to a curve of the second division member DVM2 (see FIG. 10B), the first supports adjacent to each other among the first supports SPB1 (see FIG. 10B) of the first supporting part SP1 (see FIG. 10B) may rotate, and in correspondence to a curve of the fourth division member DVM4 (see FIG. 10B), the second supports adjacent to each other among the second supports SPB2 (see FIG. 10B) of the second supporting part SP2 (see FIG. 10B) may rotate. Such a structure in which the supports SPBa, SPBb, and SPBc adjacent to each other are rotatable (for example, a structure of coupling by a link or hinge) may facilitate the accommodation of the supports SPB in the accommodation parts ACP1 and ACP2 (see FIG. 10A) in the housing HS (see FIG. 10A). In addition, the utilization of space in the housing HS (see FIG. 10A) may be increased.

Figure 12:
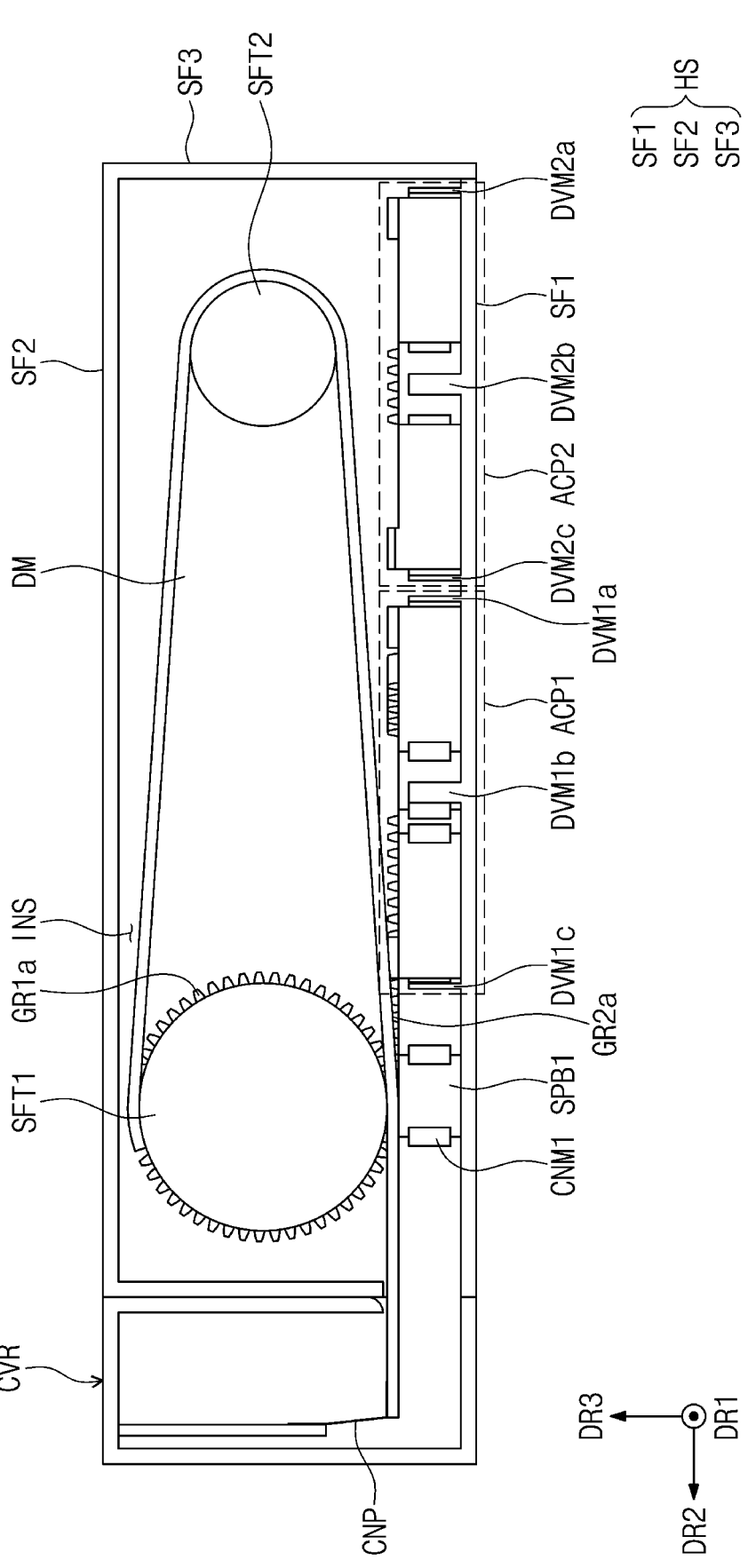
FIG. 12 is a cross-sectional view of a display device according to an embodiment of the invention.

FIG. 12 is a cross-sectional view of a display device according to an embodiment of the invention. In particular, FIG. 12 is a drawing illustrating a different embodiment from the embodiment of the invention illustrated in FIG. 10C.

A display module DM of a display device according to an embodiment of the invention may be accommodated in an inner space INS. As previously seen in FIGS. 8A and 10A, the display module DM may be wound around the shaft SFT (see FIG. 10A) in the inner space INS, but an embodiment of the invention is not limited thereto, and in another embodiment, the display module DM may be slidingly drawn in or out of the inner space INS by shafts SFT1 and SFT2.

Referring to FIG. 12, according to an embodiment of the invention, the shaft SFT1 and SFT2 may be provided in plurality. The plurality of shafts SFT1 and SFT2 may include a first shaft SFT1 and a second shaft SFT2. The first shaft SFT1 and the second shaft SFT2 may each be in contact with the display module DM. In addition, the first shaft SFT1 and the second shaft SFT2 may each support the display module DM. For example, the display module DM may be wound around or unwound from the first shaft SFT1, and the second shaft SFT2 may change an extension direction of the display module DM which is wound around or unwound from the first shaft SFT1.

Referring to the drawing, the second shaft SFT2 may be disposed between the first shaft SFT1 and the housing HS. In addition, the second shaft SFT2 may be disposed apart from a cover CVR with the first shaft SFT1 therebetween. However, an embodiment of the invention is not limited thereto, and the positions of the first shaft SFT1 and the second shaft SFT2 may vary, and is not limited to any one embodiment of the invention.

The first shaft SFT1 may be coupled to the housing HS to be rotatable. In addition, the first shaft SFT1 may be coupled to the first roller RL1 (see FIG. 8A) and the second roller RL2 (see FIG. 8A). As previously described, the straight-line motions of the supports SPB (see FIG. 8A) may be changed to the rotational motions of the rollers RL1 and RL2 (see FIG. 8A). According to the rotations of the rollers RL1 and RL2 (see FIG. 8A), the first shaft SFT1 may also rotate therewith. According to an embodiment of the invention, as the first shaft SFT1 rotates, the display module DM in contact with the first shaft SFT1 may slide in the opposite direction of a second direction DR2 that is a direction away from the cover CVR. Referring to the drawing, as the first shaft SFT1 rotates counterclockwise, the display module DM in contact with the first shaft SFT1 may slide in a direction away from the cover CVR.

In addition, an embodiment of the invention is not limited thereto, and as the first shaft SFT1 rotates, the display module DM in contact with the first shaft SFT1 may slide in the second direction DR2 that is a direction closer to the cover CVR. In this case, the rotation direction of the first shaft SFT1 may be the opposite. Referring to the drawing, as the first shaft SFT1 rotates clockwise, the display module DM in contact with the first shaft SFT1 may slide in a direction closer to the cover CVR.

The second shaft SFT2 may be coupled to the housing HS to be rotatable. When the display module DM slides in a direction closer to the cover CVR due to the rotation of the first shaft SFT1, the second shaft SFT2 may rotate while supporting the display module DM. In addition, when the display module DM slides in a direction away from the cover CVR due to the rotation of the first shaft SFT1, the second shaft SFT2 may rotate while supporting the display module DM. In this case, the rotation direction of the second shaft SFT2 may be the opposite.

Referring to the drawing, when the first shaft SFT1 rotates in a direction (for example, counterclockwise with respect to a direction toward the first direction DR1 illustrated in the drawing), the display module DM may slide in a direction away from the cover CVR. In this case, the second shaft SFT2 may rotate counterclockwise. In addition, when the second shaft SFT2 rotates clockwise (for example, clockwise with respect to a direction toward the first direction DR1 illustrated in the drawing), the display module DM may slide in a direction closer to the cover CVR. In this case, the second shaft SFT2 may rotate clockwise.

In addition, although not illustrated in the drawing, a separate driving device may be provided to the second shaft SFT2. Through the separate driving device provided to the second shaft SFT2, the second shaft SFT2 may be rotated to slide the display module DM in contact with the second shaft SFT2 in a direction away from the cover CVR or in a direction closer to the cover CVR.

Figure 13:
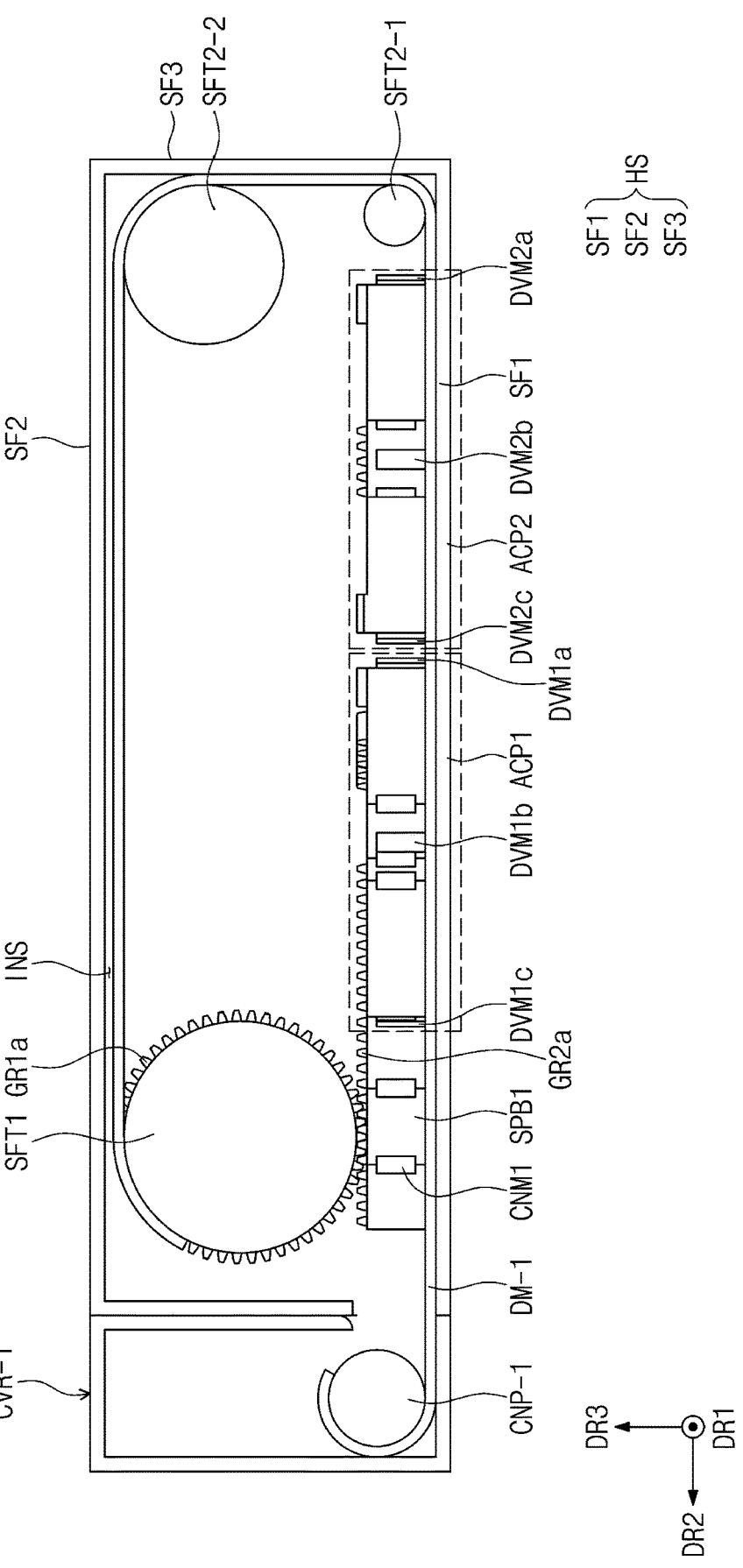
FIG. 13 is a cross-sectional view of a display device according to an embodiment of the invention.

FIG. 13 is a cross-sectional view of a display device according to an embodiment of the invention. In particular, FIG. 13 is a drawing illustrating a different embodiment from the embodiment of the invention illustrated in FIG. 10C.

A display module DM-1 of a display device according to an embodiment of the invention may be accommodated in an inner space INS. As previously seen in FIG. 10C, the display module DM (see FIG. 10C) may be drawn in and out of the housing HS between the shaft SFT (see FIG. 10C) and the first supports SPB1 (see FIG. 10C), but an embodiment of the invention is not limited thereto. In another embodiment, as illustrated in FIG. 13, the display module DM-1 may be drawn in and out of the housing HS between the first supports SPB1 and a first surface SF1 of the housing HS. In addition, the display module DM-1 may be drawn in and out of the housing HS between the second supports SPB2 (see FIG. 10A) and the first surface SF1 of the housing.

In other words, as illustrated in FIG. 13, the display module DM-1, between the first shaft SFT1 and the first surface SF1, may be drawn in and out of the housing HS while being adjacent to the first supports SPB1 and spaced apart from the first shaft SFT1, and at least a portion of the display module DM-1 may be wound around or unwound from the first shaft SFT1.

As illustrated in the drawing, the display module DM-1 may be in contact with the first shaft SFT1, a (2-1)-th shaft SFT2-1, and a (2-2)-th shaft SFT2-2. In addition, the display module DM-1 may be supported by the first shaft SFT1, the (2-1)-th shaft SFT2-1, and the (2-2)-th shaft SFT2-2.

For example, the display module DM-1 may be supported by the (2-1)-th shaft SFT2-1 and the (2-2)-th shaft SFT2-2, so that the proceeding direction of the display module DM-1 in the housing HS may be changed, and the display module DM-1 may be easily accommodated in the housing HS. In addition, through the (2-1)-th shaft SFT2-1 and the (2-2)-th shaft SFT2-2, the display module DM-1 may be easily drawn in and out of the inner space INS in the housing HS.

However, an embodiment of the invention is not limited to what is illustrated in the drawing, and only either of the (2-1)-th shaft SFT2-1 or the (2-2)-th shaft SFT2-2 may be disposed in the housing HS, and the disposing of the shaft is not limited to any one embodiment of the invention.

As previously described, a cover CVP-1 may include a connection part CNP-1 for fixing at least a portion of the display module DM-1 to the housing HS. For example, at least a portion of the display module DM may be wound around or unwound from the connection part CNP-1.

However, an embodiment of the invention is not limited to what are illustrated in FIGS. 10C and 13, and the display module DM-1 may be drawn in and out of the housing HS along a third direction, and is not limited to any one embodiment of the invention.

A display device according to an embodiment of the invention may increase utilization of space in a housing.

A display device according to an embodiment of the invention may facilitate microminiaturization of the display device.

Although the embodiments of the present invention have been described, it is understood that the present invention should not be limited to these embodiments but various changes and modifications can be made by one ordinary skilled in the art within the spirit and scope of the present invention as hereinafter claimed. Therefore, the technical scope of the invention should not be limited to the contents described in the detailed description of the specification, but should be defined by the claims.

What is claimed is:

1. A display device comprising:
a shaft extending along a first direction;
a display module wound around the shaft in a first state, and unwound from the shaft in a second direction crossing the first direction in a second state;
a first roller and a second roller positioned on opposite sides of the shaft in the first direction, respectively; and
a first supporting part and a second supporting part, which extend in the second direction in the second state to support opposite sides of the display module, respectively and which are bent in the first direction in the first state,
wherein the first roller and the second roller are in contact with the first supporting part and the second supporting part, respectively, and rotate as a state changes between the first state and the second state.

2. The display device of claim 1, further comprising a housing which accommodates the shaft, the display module, the first roller, the second roller, the first supporting part, and the second supporting part in the first state,
wherein in the second state, the display module, the first supporting part, and the second supporting part are drawn out of the housing, and
the drawn-out first and second supporting parts support the drawn-out display module.

3. The display device of claim 2, wherein the housing further comprises a first accommodation part and a second accommodation part which are spaced apart from each other, and
the first supporting part and the second supporting part are arranged in the first accommodation part and the second accommodation part in the first state, respectively.

4. The display device of claim 3, wherein the housing comprises an accommodation space overlapping the first accommodation part or the second accommodation part in a third direction crossing the first direction and the second direction, and
at least one electronic module is disposed in the accommodation space.

5. The display device of claim 3, wherein the first accommodation part and the second accommodation part are disposed on a same surface in the housing, and
the second accommodation part is disposed apart from the shaft with the first accommodation part therebetween.

6. The display device of claim 5, wherein the first accommodation part is defined by a first division member extending in the first direction and a second division member connected to one side of the first division member, and
the second accommodation part is defined by a third division member extending in the first direction and a fourth division member connected to one side of the third division member.

7. The display device of claim 6, wherein each of the first and second division members is provided in plurality,
at least one of the second division members is disposed between first division members adjacent to each other among the first division members,
each of the third and fourth division members is provided in plurality, and
at least one of the fourth division members is disposed between third division members adjacent to each other among the third division members.

8. The display device of claim 1, wherein each of the first roller and the second roller comprises a first gear, and
each of the first supporting part and the second supporting part comprises a plurality of supports including a second gear engaged with the first gear.

9. The display device of claim 8, further comprising a coupling member configured to couple supports adjacent to each other among the plurality of supports,
wherein the supports adjacent to each other are rotatable with respect to the coupling member.

10. The display device of claim 8, wherein at least one of the display module, the first supporting part, or the second supporting part comprises a magnetic substance.

11. The display device of claim 8, wherein the plurality of supports comprises:
a first supporting portion overlapping the display module; and
a second supporting portion not overlapping the display module, and including the second gear.

12. The display device of claim 1, wherein the shaft is provided in plurality, and
the plurality of shafts comprise:
a first shaft around which the display module is wound or from which the display module is unwound; and
a second shaft disposed apart from the first shaft in the second direction, and configured to change an extension direction of the display module unwound from the first shaft.

13. A display device comprising:
a housing;

a shaft accommodated in the housing and extending in a first direction;

a display module at least a portion of which is accommodated in the housing, and which is wound around the shaft in a first state and is unwound from the shaft in a second direction crossing the first direction to be drawn out of the housing in a second state;

a first roller and a second roller positioned on opposite sides of the shaft, respectively;

a first supporting part including a plurality of supports configured to rotate the first roller; and a second supporting part including a plurality of supports configured to rotate the second roller, wherein in the first state, the plurality of supports, included in the first supporting part and the second supporting part, are accommodated in the housing, and in the second state, the plurality of supports support the display module drawn out of the housing, wherein each of the first supporting part and the second supporting part includes a first end and a second end opposite to the first end in the second direction, in the second state, the first end is located further from the shaft than the second end and located in a first side of the shaft, and in the first state, the second end is located in a second side of the shaft, which is opposite to the first side in the second direction.

14. The display device of claim 13, wherein in the first state, the plurality of supports are arranged along the first direction, the second direction, or a direction different from the first direction, and in the second state, the plurality of supports are arranged along the second direction.

15. The display device of claim 13, further comprising a coupling member configured to couple supports adjacent to each other among the supports, wherein the supports adjacent to each other are rotatable with respect to the coupling member.

16. The display device of claim 13, wherein each of the first roller and the second roller comprises a first gear, and the supports comprises a second gear engaged with the first gear.

17. The display device of claim 16, wherein the plurality of supports comprises:

a first supporting portion overlapping the display module; and a second supporting portion not overlapping the display module, and including the second gear.

18. The display device of claim 13, wherein the housing further comprises a first accommodation part and a second accommodation part, which are spaced apart from each other, the supports of the first supporting part are arranged in the first accommodation part in the first state, and the supports of the second supporting part are arranged in the second accommodation part in the first state.

19. The display device of claim 18, wherein the housing further comprises:

a first surface on which the first accommodation part and the second accommodation part are defined;

a second surface opposed to the first surface; and a third surface connecting the first surface to the second surface, where the second accommodation part is disposed apart from the shaft with the first accommodation part therebetween.

20. The display device of claim 18, wherein the first accommodation part is defined by a first division member extending in the first direction and a second division member connected to one side of the first division member, and the second accommodation part is defined by a third division member extending in the first direction and a fourth division member connected to one side of the third division member.

* * * * *